(12) United States Patent
Lee et al.

(10) Patent No.: US 12,389,810 B2
(45) Date of Patent: Aug. 12, 2025

(54) NANOGAP STRUCTURE AND METHOD OF MANUFACTURING NANOGAP STRUCTURE THROUGH UNDERCUT

(71) Applicant: INDUSTRY-ACADEMIC COOPERATION FOUNDATION, DANKOOK UNIVERSITY, Gyeonggi-do (KR)

(72) Inventors: Seung-Ki Lee, Seoul (KR);
Jae-Hyoung Park, Gyeonggi-do (KR);
Hyeong-Min Kim, Gyeonggi-do (KR);
Young-Ho Nam, Gyeonggi-do (KR);
NaKyung Lee, Gyeonggi-do (KR)

(73) Assignee: Industry-Academic Cooperation Foundation, Dankook University, Gyeonggi-do (KR)

( * ) Notice: Subject to any disclaimer, the term of this patent is extended or adjusted under 35 U.S.C. 154(b) by 438 days.

(21) Appl. No.: 18/156,022

(22) Filed: Jan. 18, 2023

(65) Prior Publication Data

US 2023/0232726 A1 Jul. 20, 2023

(30) Foreign Application Priority Data

Jan. 19, 2022 (KR) .................. 10-2022-0008041
Jan. 19, 2022 (KR) .................. 10-2022-0008050
(Continued)

(51) Int. Cl.
*H10N 70/00* (2023.01)
*B82Y 15/00* (2011.01)
*B82Y 40/00* (2011.01)

(52) U.S. Cl.
CPC ............ *H10N 70/023* (2023.02); *B82Y 15/00* (2013.01); *B82Y 40/00* (2013.01)

(58) Field of Classification Search
CPC ...... H10N 70/023; B82Y 15/00; B82Y 40/00; G01N 21/554
See application file for complete search history.

(56) References Cited

U.S. PATENT DOCUMENTS 10,790,411 B2 * 9/2020 Manders ............ H10H 20/816
2013/0068719 A1 * 3/2013 Bonhote ............... G11B 5/855
216/2
(Continued)

FOREIGN PATENT DOCUMENTS

| KR | 10-1485739 B1 | 1/2015 |
| KR | 101878600 B1 | 7/2018 |
| KR | 10-2233028 B1 | 3/2021 |
| KR | 10-2233031 B1 | 3/2021 |

OTHER PUBLICATIONS

ACS Sensors, "Fiber Optic Plasmonic Sensors Based on Nanodome Arrays with Nanogaps," Hyeong-Min Kim, 7, 1451-1457 (2022).
(Continued)

*Primary Examiner* — Mamadou L Diallo
(74) *Attorney, Agent, or Firm* — Meunier Carlin & Curfman LLC

(57) ABSTRACT

Disclosed are a nanogap structure and a method of manufacturing the nanogap structure through undercut. The method includes forming a nanosized gap between primary metal and secondary metal by undercutting the primary metal such that the width of the primary metal at a lower end of a bead is less than the width of the bead. The method includes manufacturing a ring structure or a ring disk structure including a nanosized gap varying depending on a degree of undercut.

13 Claims, 17 Drawing Sheets

(30) Foreign Application Priority Data

| | | |
|---|---|---|
| Jan. 19, 2022 | (KR) | 10-2022-0008055 |
| Jan. 19, 2022 | (KR) | 10-2022-0008060 |
| Jan. 19, 2022 | (KR) | 10-2022-0008062 |
| Jan. 19, 2022 | (KR) | 10-2022-0008068 |
| Jan. 19, 2022 | (KR) | 10-2022-0008075 |
| Jan. 19, 2022 | (KR) | 10-2022-0008079 |
| May 17, 2022 | (KR) | 10-2022-0060324 |

(56) References Cited

U.S. PATENT DOCUMENTS

| | | | | |
|---|---|---|---|---|
| 2015/0191825 | A1* | 7/2015 | Hildreth | C23C 18/1657 |
| | | | | 427/256 |
| 2018/0045856 | A1* | 2/2018 | Hong | G02B 1/007 |
| 2022/0336597 | A1* | 10/2022 | Anthopoulos | H10D 64/205 |
| 2024/0410876 | A1* | 12/2024 | Shao | G01N 33/57492 |

OTHER PUBLICATIONS

ACS Nano, "Controllable Fabrication of Two-Dimensional Patterned VO2 Nanoparticle, Nanodome, and Nanonet Arrays with Tunable Temperature-Dependent Localized Surface Plasmon Resonancem," Yujie Ke, 11, 7542-7551 (2017).

English abstract of Kim, Hyeong-Min, et al. "A study on high performance localized surface plasmon resonance sensor using nanostructure on the optical fiber" Dankook University, Jun. 10, 2021.

Sun, Zhiqiang, et al. "A Universal Approach to Fabricate Various Nanoring Arrays Based on a Colloidal-Crystal-Assisted-Lithography Strategy" Advanced Functional Materials. 2008 (18), 4036-4042.

Antohe, Iulia, et al. "Nanoscale patterning of gold-coated optical fibers for improved plasmonic sensing" Nanotechnology, Apr. 2017.

Liang, Yuzhang, et al. "Subradiant Dipolar Interactions in Plasmonic Nanoring Resonator Array for Integrated Label-Free Biosensing" ACS Sens, Dec. 22, 2017; 2(12); 1796-1804.

Xu, Xiaobin, et al. "Multiple-Patterning Nanosphere Lithography for Fabricating Periodic Three-Dimensional Hierarchical Nanostructures" ACS Nano 2017, 11, 10384-10391.

Al, Bin, et al. "Confined surface plasmon sensors based on strongly coupled disk-in-volcano arrays" The Royal Society of Chemistry. 2013. 1-3.

Large, Nicolas, et al. "Plasmonic properties of gold ring-disk nano-resonators: fine shape details matter", Optics Express. 2011. vol. 19, issue 6, p. 5587-5595.

* cited by examiner

NANOGAP STRUCTURE AND METHOD OF MANUFACTURING NANOGAP STRUCTURE THROUGH UNDERCUT

CROSS-REFERENCE TO RELATED APPLICATION(S)

This application claims the priority benefit of Korean Patent Application No. 10-2022-0008079 filed on Jan. 19, 2022, Korean Patent Application No. 10-2022-0008075 filed on Jan. 19, 2022, Korean Patent Application No. 10-2022-0008068 filed on Jan. 19, 2022, Korean Patent Application No. 10-2022-0008062 filed on Jan. 19, 2022, Korean Patent Application No. 10-2022-0008060 filed on Jan. 19, 2022, Korean Patent Application No. 10-2022-0008055 filed on Jan. 19, 2022, Korean Patent Application No. 10-2022-0008050 filed on Jan. 19, 2022, Korean Patent Application No. 10-2022-0008041 filed on Jan. 19, 2022, and Korean Patent Application No. 10-2022-0060324 filed on May 17, 2022, in the Korean Intellectual Property Office, the disclosures of which are incorporated herein in their entirety by reference for all purposes.

BACKGROUND

1. Field

One or more embodiments relate to a nanogap structure and a method of manufacturing the nanogap structure through undercut.

2. Description of Related Art

Surface plasmon resonance is a phenomenon caused by collective vibration of free electrons when incident light reacts with a thin metal film, such as gold or silver, or a nanoparticle or a nanostructure.

Surface plasmon resonance has been applied to biosensors for sensing various bioreactions and protein chip analysis because reaction between biomaterials, without a specific indicator, may be sensed in real time through surface plasmon resonance. A surface plasmon resonance sensor may be used in various sensing, such as sensing specific binding between proteins through surface plasmon resonance.

SUMMARY

The present disclosure may be used for a sensor to sense the concentration of a sensing target by forming a ring structure, a ring disk structure, or a dome structure, which includes a nanosized gap on a surface of a substrate or a surface of an optical fiber.

An aspect provides a nanostructure including a disk and a mesh based on a bead and a method of manufacturing the nanostructure.

According to an aspect, a ring structure includes primary metal in a disk form in a center of the ring structure, secondary metal in a position spaced apart by a nanosized gap from the primary metal, and a ring of which the width is as narrow as the nanosized gap, in which the nanosized gap varies depending on a degree of undercut applied to the primary metal.

The nanosized gap may vary depending on a degree of undercut etching the primary metal such that the width of the primary metal at a lower end of a bead used to manufacture the ring structure may be less than the width of the bead.

The nanosized gap may increase as a degree of additional etching of the primary metal through undercut increases.

The primary metal and the secondary metal may be conductive and may include the same material or different materials.

According to another aspect, a ring disk structure includes primary metal in a disk form in a center of the ring disk structure and secondary metal in a ring form surrounding the primary metal, in which the primary metal and the secondary metal are spaced apart from each other by a nanosized gap, and the nanosized gap varies depending on a degree of undercut applied to the primary metal.

The nanosized gap may vary depending on a degree of undercut etching the primary metal such that the width of the primary metal at a lower end of a bead used to manufacture the ring structure may be less than the width of the bead.

A gap between rings that are formed of the secondary metal may vary depending on a time of reflow of the bead at an upper end of the primary metal in a manufacturing process of the ring disk structure.

The primary metal and the secondary metal may be conductive and may include the same material or different materials.

According to another aspect, a method of manufacturing a ring structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead and performing undercut etching the primary metal such that the width of the primary metal is less than the width of the bead, depositing secondary metal on the surface of the substrate exposed by a gap between the beads with the primary metal etched or on the cross-section of the core layer of the optical fiber, and extracting the ring structure including a nanosized gap between the primary metal and the secondary metal by removing the beads.

The primary metal in a disk form may be in a center of the ring structure and a ring of which the width is as narrow as the nanosized gap may be between the primary metal and the secondary metal.

The nanosized gap may vary depending on a degree of undercut applied to the primary metal.

The nanosized gap may vary depending on a degree of undercut etching the primary metal such that the width of the primary metal at a lower end of the bead is less than the width of the bead.

The nanosized gap may increase as a degree of additional etching of the primary metal through undercut increases.

The primary metal and the secondary metal may be conductive and may include the same material or different materials.

According to another aspect, a method of manufacturing a ring disk structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead and performing undercut etching the primary metal such that the width of the primary metal is less than the width of the bead, depositing secondary metal on the surface of the substrate exposed by a gap between the beads with the primary metal etched or on the cross-section of the core layer of the optical fiber, performing reflow on the beads, etching the secondary metal deposited through the gap between the beads, and extracting the ring disk structure including a nanosized gap between the primary metal and the secondary metal by removing the beads.

The ring disk structure may include primary metal in a disk form in a center of the ring disk structure and the secondary metal in a ring form surrounding the primary metal, in which the primary metal and the secondary metal may be spaced apart from each other by a nanosized gap.

The nanosized gap may vary depending on a degree of undercut etching the primary metal such that the width of the primary metal at a lower end of the bead is less than the width of the bead.

A gap between rings that are formed of the secondary metal varies depending on a time of reflow of the bead at an upper end of the primary metal.

The primary metal and the secondary metal may be conductive and may include the same material or different materials.

According to another aspect, a sensor to which a ring structure is applied is configured to sense a sensing target through the ring structure on a surface of a substrate or a cross-section of an optical fiber, and the ring structure includes primary metal in a disk form in a center of the ring structure, secondary metal in a position spaced apart by a nanosized gap from the primary metal, and a ring of which the width is as narrow as the nanosized gap, in which the nanosized gap varies depending on a degree of undercut applied to the primary metal.

According to another aspect, a sensor to which a ring disk structure is applied is configured to sense a sensing target through the ring disk structure on a surface of a substrate or a cross-section of an optical fiber, and the ring disk structure includes primary metal in a disk form in a center of the ring disk structure and secondary metal in a ring form surrounding the primary metal, in which the primary metal and the secondary metal are spaced apart from each other by a nanosized gap, and the nanosized gap varies depending on a degree of undercut applied to the primary metal.

According to another aspect, a ring structure includes primary metal in a disk form in a center of the ring structure, secondary metal in a position spaced apart by a nanosized gap from the primary metal, and a ring of which the width is as narrow as the nanosized gap, in which the nanosized gap varies depending on the thickness of a material coating a bead in a manufacturing process of the ring structure.

The nanosized gap may vary depending on the thickness of a material coating a side surface of a bead used to manufacture the ring structure.

The nanosized gap may increase as the thickness of the material increases.

The primary metal and the secondary metal may be conductive and may include the same material or different materials, and the material may comprise an oxide.

According to another aspect, a ring disk structure includes primary metal in a disk form in a center of the ring disk structure and secondary metal in a ring form surrounding the primary metal, in which the primary metal and the secondary metal are spaced apart from each other by a nanosized gap and the nanosized gap varies depending on the thickness of a material coating a bead in a manufacturing process of the ring disk structure.

The nanosized gap may vary depending on the thickness of a material coating a side surface of a bead used to manufacture the ring disk structure.

The nanosized gap may increase as the thickness of the material increases.

The primary metal and the secondary metal may be conductive and may include the same material or different materials, and the material may include an oxide.

According to another aspect, a method of manufacturing a ring structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead, coating a material on the surface of the bead and the surface of the substrate on which the primary metal is exposed by a gap between the beads or on the cross-section of the core layer of the optical fiber, maintaining the material on a side surface of the bead by anisotropically etching the material, depositing secondary metal on the surface of the substrate exposed by a gap between the material coating an upper end of the bead and the material coating the side surface of the bead or on the core layer of the optical fiber, and extracting the ring structure including a nanosized gap between the primary metal and the secondary metal by removing the beads.

The primary metal in a disk form may be in a center of the ring structure and a ring of which the width is as narrow as the nanosized gap may be between the primary metal and the secondary metal.

The nanosized gap may vary depending on the thickness of the material coating the side surface of the bead.

The nanosized gap may increase as the thickness of the material coating the side surface of the bead increases.

The material coating the surface of the substrate or the core layer of the optical fiber may be removed through anisotropic etching and the material coating an upper end of the bead may be removed.

The primary metal and the secondary metal may be conductive and may include the same material or different materials, and the material may include an oxide.

According to another aspect, a method of manufacturing a ring disk structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead, coating a material on the surface of the bead and the surface of the substrate on which the primary metal is exposed by a gap between the beads or on the cross-section of the core layer of the optical fiber, maintaining the material on a side surface of the bead by anisotropically etching the material, depositing secondary metal on the surface of the substrate exposed by a gap between the beads with the primary metal etched or the core layer of the optical fiber and an upper end of the bead, performing reflow on the beads, etching secondary metal deposited through a gap between the beads, and extracting the ring disk structure including a nanosized gap between the primary metal and the secondary metal by removing the beads.

The ring disk structure may include primary metal in a disk form in a center of the ring disk structure and the secondary metal in a ring form surrounding the primary metal, in which the primary metal and the secondary metal may be spaced apart from each other by a nanosized gap.

The nanosized gap may vary depending on the thickness of the material coating the side surface of the bead.

The nanosized gap may increase as the thickness of the material coating the side surface of the bead increases.

The primary metal and the secondary metal may be conductive and may include the same material or different materials, and the material may include an oxide.

According to another aspect, a sensor to which a ring structure is applied is configured to sense a sensing target through the ring structure on a surface of a substrate or a cross-section of an optical fiber, and the ring structure includes primary metal in a disk form in a center of the ring structure, secondary metal in a position spaced apart by a nanosized gap from the primary metal, and a ring of which the width is as narrow as the nanosized gap, in which the nanosized gap varies depending on the thickness of a material coating a bead in a manufacturing process of the ring structure.

According to another aspect, a sensor to which a ring disk structure is applied is configured to sense a sensing target through the ring disk structure on a surface of a substrate or a cross-section of an optical fiber, and the ring disk structure includes primary metal in a disk form in a center of the ring disk structure and secondary metal in a ring form surrounding the primary metal, in which the primary metal and the secondary metal are spaced apart from each other by a nanosized gap, and the nanosized gap varies depending on the thickness of a material coating a bead in a manufacturing process of the ring disk structure.

According to another aspect, a ring structure includes primary metal in a disk form in a center of the ring structure, secondary metal in a position spaced apart by a nanosized gap from the primary metal, and a ring of which the width is as narrow as the nanosized gap, in which the nanosized gap varies depending on the thickness of a capping material capping a bead in a manufacturing process of the ring structure.

The nanosized gap may vary depending on the thickness of a capping material surrounding a bead used to manufacture the ring structure.

The nanosized gap may increase as the thickness of the capping material increases.

The primary metal and the secondary metal may be conductive and may include the same material or different materials, and the capping material may chemically grow from a bead that is a seed and may cap the bead.

According to another aspect, a ring disk structure includes primary metal in a disk form in a center of the ring disk structure and secondary metal in a ring form surrounding the primary metal, in which the primary metal and the secondary metal are spaced apart from each other by a nanosized gap and the nanosized gap varies depending on the thickness of a capping material capping a bead in a manufacturing process of the ring disk structure.

The nanosized gap may vary depending on the thickness of a capping material surrounding a bead used to manufacture the ring disk structure.

The nanosized gap may increase as the thickness of the capping material increases.

The primary metal and the secondary metal may be conductive and may include the same material or different materials, and the capping material may chemically grow from a bead that is a seed and may cap the bead.

According to another aspect, a method of manufacturing a ring structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead, capping the beads with capping materials, depositing secondary metal on an upper end of the bead capped with the capping materials and the surface of the substrate exposed by a gap between the capping materials capping the beads or the core layer of the optical fiber, and extracting the ring structure including a nanosized gap between the primary metal and the secondary metal by removing the beads.

The primary metal in a disk form may be in a center of the ring structure and a ring of which the width is as narrow as the nanosized gap may be between the primary metal and the secondary metal.

The nanosized gap may vary depending on the thickness of the capping material capping the beads.

The nanosized gap may increase as the thickness of the capping material increases.

The capping materials may chemically grow from a bead that is a seed and may cap the bead.

The primary metal and the secondary metal may be conductive and may include the same material or different materials.

According to another aspect, a method of manufacturing a ring disk structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead, capping the beads with capping materials, depositing secondary metal on the surface of the substrate exposed by a gap between an upper end of the bead capped with the capping materials and the capping materials capping the beads or on the core layer of the optical fiber, performing reflow on the beads, etching the secondary metal deposited through a gap between the capping materials capping the beads, and extracting the ring disk structure including a nanosized gap between the primary metal and the secondary metal by removing the beads.

The ring disk structure may include primary metal in a disk form in a center of the ring disk structure and the secondary metal in a ring form surrounding the primary metal, in which the primary metal and the secondary metal may be spaced apart from each other by a nanosized gap.

The nanosized gap may vary depending on the thickness of the capping material capping the beads.

The nanosized gap may increase as the thickness of the capping material increases.

The primary metal and the secondary metal may be conductive and may include the same material or different materials, and the capping materials may chemically grow from a bead that is a seed and may cap the bead.

According to another aspect, a sensor to which a ring structure is applied is configured to sense a sensing target through the ring structure on a surface of a substrate or a cross-section of an optical fiber, and the ring structure includes primary metal in a disk form in a center of the ring structure, secondary metal in a position spaced apart by a nanosized gap from the primary metal, and a ring of which the width is as narrow as the nanosized gap, in which the nanosized gap varies depending on the thickness of a capping material capping a bead in a manufacturing process of the ring structure.

According to another aspect, a sensor to which a ring disk structure is applied is configured to sense a sensing target through the ring disk structure on a surface of a substrate or a cross-section of an optical fiber, and the ring disk structure includes primary metal in a disk form in a center of the ring disk structure and secondary metal in a ring form surrounding the primary metal, in which the primary metal and the secondary metal are spaced apart from each other by a nanosized gap, and the nanosized gap varies depending on the thickness of a capping material capping a bead in a manufacturing process of the ring disk structure.

According to another aspect, a ring structure includes primary metal in a disk form in a center of the ring structure, secondary metal in a position spaced apart by a nanosized gap from the primary metal, and a ring of which the width is as narrow as the nanosized gap, in which the nanosized gap varies depending on a time of reflow of a bead used in a manufacturing process of the ring structure.

The nanosized gap may vary depending on a time of reflow such that the bead flows laterally, which is used to manufacture the ring structure.

The nanosized gap may increase as the time of reflow of the bead increases.

The primary metal and the secondary metal may be conductive and may include the same material or different materials.

According to another aspect, a method of manufacturing a ring structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead, performing reflow on the beads such that the beads spread laterally, depositing secondary metal on an upper end of the beads and a surface of a substrate exposed by a gap between the beads through the reflow or the core layer of the optical fiber, and extracting the ring structure including a nanosized gap between the primary metal and the secondary metal by removing the beads.

The primary metal in a disk form may be in a center of the ring structure and a ring of which the width is as narrow as the nanosized gap may be between the primary metal and the secondary metal.

The nanosized gap may vary depending on a time of reflow of the beads.

The gap between the beads may decrease through the reflow of the beads.

The nanosized gap may increase as the time of reflow of the beads increases.

The primary metal and the secondary metal may be conductive and may include the same material or different materials.

According to another aspect, a sensor to which a ring structure is applied is configured to sense a sensing target through the ring structure on a surface of a substrate or a cross-section of an optical fiber, and the ring structure includes primary metal in a disk form in a center of the ring structure, secondary metal in a position spaced apart by a nanosized gap from the primary metal, and a ring of which the width is the nanosized gap, in which the nanosized gap varies depending on a time of reflow of a bead used in a manufacturing process of the ring structure.

The nanosized gap may vary depending on a time of reflow such that the bead flows laterally, which is used to manufacture the ring structure.

The nanosized gap may increase as the time of reflow of the bead increases.

The primary metal and the secondary metal may be conductive and may include the same material or different materials.

According to another aspect, a dome structure includes primary metal at a lower end of beads used in a manufacturing process of the dome structure and secondary metal at an upper end of the bead and between the beads, in which the beads are in a dome form corresponding to the width of the primary metal, a nanosized gap is between the primary metal and the secondary metal, and the nanosized gap may vary depending on a degree of undercut applied to the primary metal.

The nanosized gap may vary depending on a degree of undercut etching the primary metal such that the width of the primary metal at a lower end of the bead is less than the width of the bead in a dome form.

The nanosized gap may increase as a degree of additional etching of the primary metal through undercut increases.

The primary metal and the secondary metal may be conductive and may include the same material or different materials.

According to another aspect, a method of manufacturing a dome structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead, performing reflow on the beads such that the width of the bead is as narrow as the width of the primary metal and forming the beads in a dome form, performing undercut such that the primary metal is etched less than the width of the bead in a dome form, depositing secondary metal on an upper end of the bead in a dome form and the surface of the substrate exposed by a gap between the beads or on the cross-section of the core layer of the optical fiber, and reducing the width of the bead in a dome form to the width of the primary metal by applying thermal annealing to the beads.

The primary metal at a lower end of the bead where the secondary metal is deposited may be spaced apart by a nanosized gap from the secondary metal deposited between the beads in a dome form.

The nanosized gap may vary depending on a degree of undercut applied to the primary metal.

The nanosized gap may vary depending on a degree of undercut etching the primary metal such that the width of the primary metal at a lower end of the bead is less than the width of the bead in a dome form.

The nanosized gap may increase as a degree of additional etching of the primary metal through undercut increases.

The primary metal and the secondary metal may be conductive and may include the same material or different materials.

According to another aspect, a sensor to which a dome structure is applied is configured to sense a sensing target through the dome structure on a surface of a substrate or a cross-section of an optical fiber and the dome structure includes primary metal at a lower end of beads used in a manufacturing process of the dome structure and secondary metal at an upper end of the bead and between the beads, in which the beads are in a dome form corresponding to the width of the primary metal, a nanosized gap is between the primary metal and the secondary metal, and the nanosized gap may vary depending on a degree of undercut applied to the primary metal.

The nanosized gap may vary depending on a degree of undercut etching the primary metal such that the width of the primary metal at a lower end of the bead is less than the width of the bead in a dome form.

The nanosized gap may increase as a degree of additional etching of the primary metal through undercut increases.

The primary metal and the secondary metal may be conductive and may include the same material or different materials.

According to another aspect, a dome structure includes primary metal at a lower end of beads used in a manufacturing process of the dome structure and secondary metal at an upper end of the bead and between the beads, in which the beads are in a dome form corresponding to the width of the primary metal, a nanosized gap is between the primary metal and the secondary metal, and the nanosized gap may vary depending on the thickness of a material removed after coating the beads in a dome form.

The nanosized gap may vary depending on the thickness of a material removed after coating a side surface of the bead.

The nanosized gap may increase as the thickness of the material increases.

The primary metal and the secondary metal may be conductive and may include the same material or different materials.

According to another aspect, a method of manufacturing a dome structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead, performing reflow on the beads such that the width of the bead is as narrow as the width of the primary metal and forming the beads in a dome form, coating a material on a surface of the bead in a dome form and a gap between the beads, maintaining the material on a side surface of the bead by anisotropically etching the material, depositing secondary metal on the surface of the substrate exposed by a gap between the material coating an upper end of the bead in a dome form and the material coating the side surface of the bead or a cross-section of the core layer of the optical fiber, applying thermal annealing to the beads and reducing the width of the bead in a dome form to the width of the primary metal, and removing the material coating the side surface of the bead.

The primary metal at a lower end of the bead where the secondary metal is deposited may be spaced apart by a nanosized gap from the secondary metal deposited between the beads in a dome form.

The nanosized gap may vary depending on the thickness of a material removed after coating a side surface of the bead.

The nanosized gap may increase as the thickness of the material increases.

The primary metal and the secondary metal may be conductive and may include the same material or different materials.

According to another aspect, a sensor to which a dome structure is applied is configured to sense a sensing target through the dome structure on a surface of a substrate or a cross-section of an optical fiber and the dome structure includes primary metal at a lower end of beads used in a manufacturing process of the dome structure and secondary metal at an upper end of the bead and between the beads, in which the beads are in a dome form corresponding to the width of the primary metal, a nanosized gap is between the primary metal and the secondary metal, and the nanosized gap may vary depending on the thickness of a material removed after coating the beads in a dome form.

The nanosized gap may vary depending on the thickness of a material removed after coating a side surface of the bead.

The nanosized gap may increase as the thickness of the material increases.

The primary metal and the secondary metal may be conductive and may include the same material or different materials.

According to another aspect, a dome structure includes primary metal at a lower end of beads used in a manufacturing process of the dome structure and secondary metal at an upper end of the bead and between the beads, in which the beads are in a dome form corresponding to the width of the primary metal, a nanosized gap is between the primary metal and the secondary metal, and the nanosized gap may vary depending on the thickness of a capping material capping the beads in a dome form.

The nanosized gap may vary depending on the thickness of a capping material capping the surface of the bead, and the capping material may grow by chemically reacting with the surface of the bead.

The nanosized gap may increase as the thickness of the capping material increases.

The primary metal and the secondary metal may be conductive and may include the same material or different materials.

According to another aspect, a method of manufacturing a dome structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead, performing reflow on the beads such that the width of the bead is as narrow as the width of the primary metal and forming the beads in a dome form, capping the beads in the beads in a dome form with capping materials, depositing secondary metal on the surface of the substrate exposed by a gap between the capping materials capping the beads or on the cross-section of the core layer of the optical fiber, and reducing the width of the bead in a dome form to the width of the primary metal by applying thermal annealing to the beads.

The primary metal at a lower end of the bead where the secondary metal is deposited may be spaced apart by a nanosized gap from the secondary metal deposited between the beads in a dome form.

The nanosized gap may vary depending on the thickness of a capping material capping the surface of the bead, and the capping material may grow by chemically reacting with the surface of the bead.

The nanosized gap may increase as the thickness of the capping material increases.

The primary metal and the secondary metal may be conductive and may include the same material or different materials.

According to another aspect, a sensor to which a dome structure is applied is configured to sense a sensing target through the dome structure on a surface of a substrate or a cross-section of an optical fiber and the dome structure includes primary metal at a lower end of beads used in a manufacturing process of the dome structure and secondary metal at an upper end of the bead and between the beads, in which the beads are in a dome form corresponding to the width of the primary metal, a nanosized gap is between the primary metal and the secondary metal, and the nanosized gap may vary depending on the thickness of a capping material capping the beads in a dome form.

The nanosized gap may vary depending on the thickness of a capping material capping the surface of the bead, and the capping material may grow by chemically reacting with the surface of the bead.

The nanosized gap may increase as the thickness of the capping material increases.

The primary metal and the secondary metal may be conductive and may include the same material or different materials.

According to another aspect, a dome structure includes primary metal at a lower end of beads used in a manufacturing process of the dome structure and secondary metal at an upper end of the bead and between the beads, in which the beads are in a dome form corresponding to the width of the primary metal, a nanosized gap is between the primary metal and the secondary metal, and the nanosized gap may vary depending on secondary bead reflow such that the width of the bead in a dome form is greater than the width of the primary metal after primary bead reflow.

The width of the bead in a dome form may be greater than the width of the primary metal according to a time of the secondary bead reflow, and the nanosized gap may be as narrow as a difference between the width of the bead in a dome form and the width of the primary metal.

The nanosized gap may increase as the time of secondary bead reflow of the beads increases.

The primary metal and the secondary metal may be conductive and may include the same material or different materials.

According to another aspect, a method of manufacturing a dome structure includes depositing primary metal on a surface of a substrate or a cross-section of a core layer of an optical fiber, close-packing beads on a surface of the deposited primary metal, etching the close-packed beads, etching the primary metal such that the width of the primary metal is as narrow as the width of the bead, performing reflow on the beads such that the width of the bead is as narrow as the width of the primary metal and forming the beads in a dome form, performing undercut such that the primary metal is etched less than the width of the bead in a dome form, depositing secondary metal on an upper end of the bead in a dome form and the surface of the substrate exposed by a gap between the beads or on the cross-section of the core layer of the optical fiber, and reducing the width of the bead in a dome form to the width of the primary metal by applying thermal annealing to the beads.

The primary metal at a lower end of the bead where the secondary metal is deposited may be spaced apart by a nanosized gap from the secondary metal deposited between the beads in a dome form.

The width of the bead in a dome form may be greater than the width of the primary metal according to a time of the secondary bead reflow, and the nanosized gap may be as narrow as a difference between the width of the bead in a dome form and the width of the primary metal.

The nanosized gap may increase as the time of secondary bead reflow of the beads increases.

The primary metal and the secondary metal may be conductive and may include the same material or different materials.

According to another aspect, a sensor to which a dome structure is applied is configured to sense a sensing target through the dome structure on a surface of a substrate or a cross-section of an optical fiber and the dome structure includes primary metal at a lower end of beads used in a manufacturing process of the dome structure and secondary metal at an upper end of the bead and between the beads, in which the beads are in a dome form corresponding to the width of the primary metal, a nanosized gap is between the primary metal and the secondary metal, and the nanosized gap may vary depending on secondary bead reflow such that the width of the bead in a dome form is greater than the width of the primary metal after the primary bead reflow.

The width of the bead in a dome form may be greater than the width of the primary metal according to a time of the secondary bead reflow, and the nanosized gap may be as narrow as a difference between the width of the bead in a dome form and the width of the primary metal.

The nanosized gap may increase as the time of secondary bead reflow of the beads increases.

The primary metal and the secondary metal may be conductive and may include the same material or different materials.

According to another aspect, a nanostructure includes a substrate, a disk in a circular form at an upper end of the substrate, and a mesh in a hexagonal form around the disk, in which the disk and the mesh may be spaced apart from each other by a nanosized gap.

The disk and the mesh may include a conductive metal material.

The disk and the mesh may be formed by etching, for a certain time, beads that are close-packed in a metal material deposited on the substrate.

According to another aspect, a method of manufacturing a nanostructure includes depositing a metal material on a substrate, disposing beads on the deposited metal material, transforming the beads into a pillar on a dome and a mesh that are on a disk by continuously applying reactive ion etching to the beads, removing a metal material exposed by a nanosized gap between the dome and the pillar after applying reactive ion etching to the beads, and exposing the disk and the mesh including a metal material by removing the dome and the pillar from the beads, in which the disk is circular and the mesh is hexagonal.

The beads may be close-packed in the metal material deposited on the substrate.

The present disclosure may be used for a sensor to sense the concentration of a sensing target by forming a ring structure, a ring disk structure, or a dome structure, which includes a nanosized gap on a surface of a substrate or a surface of an optical fiber.

Disclosed are a nanostructure in a new form including a disk and a mesh based on beads and a manufacturing method of the nanostructure.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the present disclosure will become apparent and more readily appreciated from the following description of example embodiments, taken in conjunction with the accompanying drawings of which.

DETAILED DESCRIPTION

Figure 1:
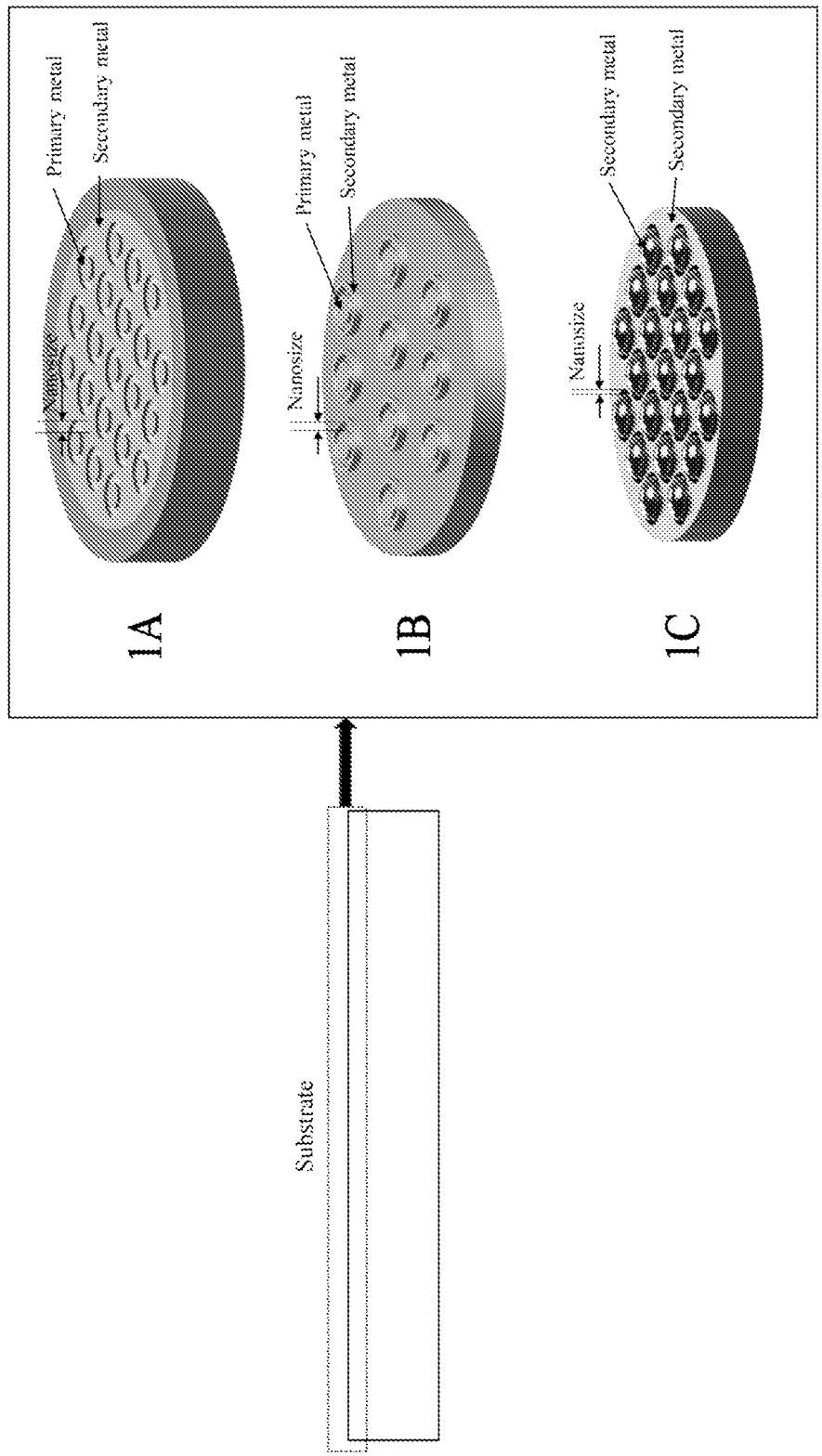
FIG. 1 is a diagram illustrating a nanogap structure on a substrate, according to an embodiment.

Hereinafter, examples are described in detail with reference to the accompanying drawings. The scope of the right, however, should not be construed as limited to the embodiments set forth herein. In the drawings, like reference numerals are used for like elements.

Various modifications may be made to the examples. Here, the examples are not construed as limited to the disclosure and should be understood to include all changes, equivalents, and replacements within the idea and the technical scope of the disclosure.

Although terms of "first" or "second" are used to explain various components, the components are not limited to the terms. These terms should be used only to distinguish one component from another component. For example, a first component may be referred to as a second component, and similarly the second component may also be referred to as the first component.

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the examples with reference to the accompanying drawings, like reference numerals refer to like constituent elements and a repeated description related thereto will be omitted. In the description of embodiments, detailed description of well-known related structures or functions will be omitted when it is deemed that such description will cause ambiguous interpretation of the present disclosure.

Hereinafter, embodiments are described in detail with reference to the accompanying drawings.

Surface plasmon resonance may be a phenomenon caused by collective vibration of free electrons when incident light reacts with a thin metal film, such as gold or silver, or a nanoparticle or a nanostructure. Surface plasmon resonance may be applied to biosensors for sensing various bioreactions and protein chip analysis because reaction between biomaterials, without a specific indicator, may be sensed in real time through surface plasmon resonance.

A surface plasmon resonance sensor may be a sensor using surface plasmon resonance. The surface plasmon resonance sensor may be used to sense specific binding between proteins through an output signal by reaction of an antigen, that is, a sensing target, with an antibody adhered to a surface of the surface plasmon resonance sensor.

According to an embodiment, when a sensor senses light output from a light source, the concentration of a sensing target may be sensed based on a degree of scattering of the light by a structure, including a nanosized gap, on a substrate. Alternatively, according to an embodiment, the concentration of the sensing target may be sensed based on a degree of scattering of light by a structure, including a nanosized gap, on a cross-section of an optical fiber, in which the light incident on the optical fiber is totally reflected inside a core layer of the optical fiber and travels. Hereinafter, a structure, including a nanosized gap, which may be on a substrate or a cross-section of an optical fiber, is described in detail.

FIG. 1 is a diagram illustrating a nanogap structure on a substrate, according to an embodiment.

FIG. 1 illustrates an example of the nanogap structure on a surface of the substrate. According to an embodiment, the nanogap structure may be a structure including a nanosized gap, and any one of a concave ring structure 1A, a ring disk structure 1B, and a dome structure 1C, including a nanosized gap, may be on the surface of the substrate.

The concave ring structure 1A may be a structure including a concave ring that is as narrow as a nanosized gap between primary metal and secondary metal. The ring disk structure 1B may be a structure on which the secondary metal in a ring form is spaced apart by a nanosized gap from the primary metal in a disk form. The dome structure 1C may be a structure including domes on which the secondary metal is deposited. The domes on which the secondary metal is deposited in the dome structure 1C may be spaced apart by a nanosized gap from the secondary metal that is deposited around the domes.

According to an embodiment, a nanopattern may widely be on the surface of the substrate by masking hundreds of nanometers (nm) of two-dimensional (2D) nanoparticles on the surface of the substrate. For example, various forms of nanogap structures may be manufactured by close-packing a bead including at least one of metal, oxide, and polymer. When light output from a light source on one side of the substrate is sensed by a sensor on the other side of the substrate, the concentration of a sensing target may be sensed based on a degree of scattering of the light by the sensing target adhered to a nanogap structure on the surface of the substrate.

The concave ring structure 1A may be mass-produced at a low cost through a batch process of nanosphere lithography. A nanosized gap may cause a hot spot effect. A grating effect may be expected because of a periodic arrangement.

The area of the secondary metal may decrease by forming a ring structure in the ring disk structure 1B compared to the concave ring structure 1A, and a background signal may decrease. The area of the secondary metal may decrease in the ring disk structure 1B compared to the concave ring structure 1A, and the area of signal collection may increase.

A sensing area increases in the dome structure 1C, and an electric field may increase in a broad area. An electric field may concentrate in a local area in the concave ring structure 1A and the ring disk structure 1B, but the electric field may concentrate in a broader area in the dome structure 1C compared to the concave ring structure 1A or the ring disk structure 1B.

Figure 2:
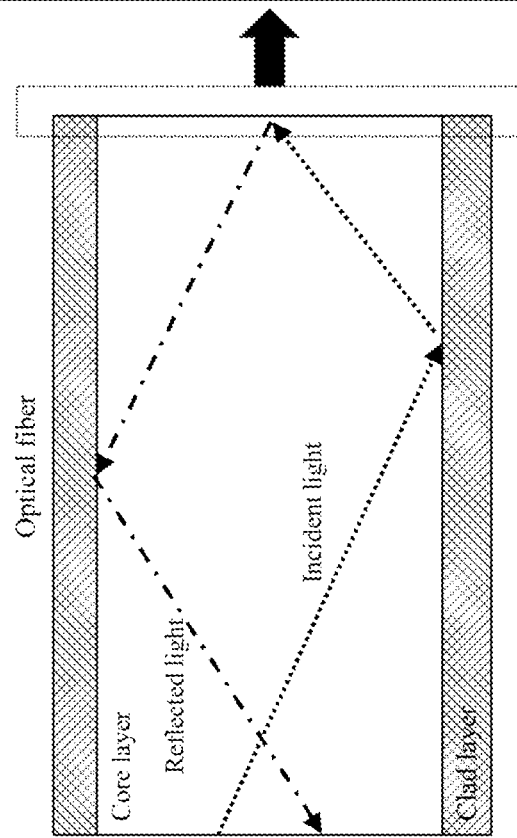
FIG. 2 is a diagram illustrating a nanogap structure on a cross-section of an optical fiber, according to an embodiment.
Figure 2:
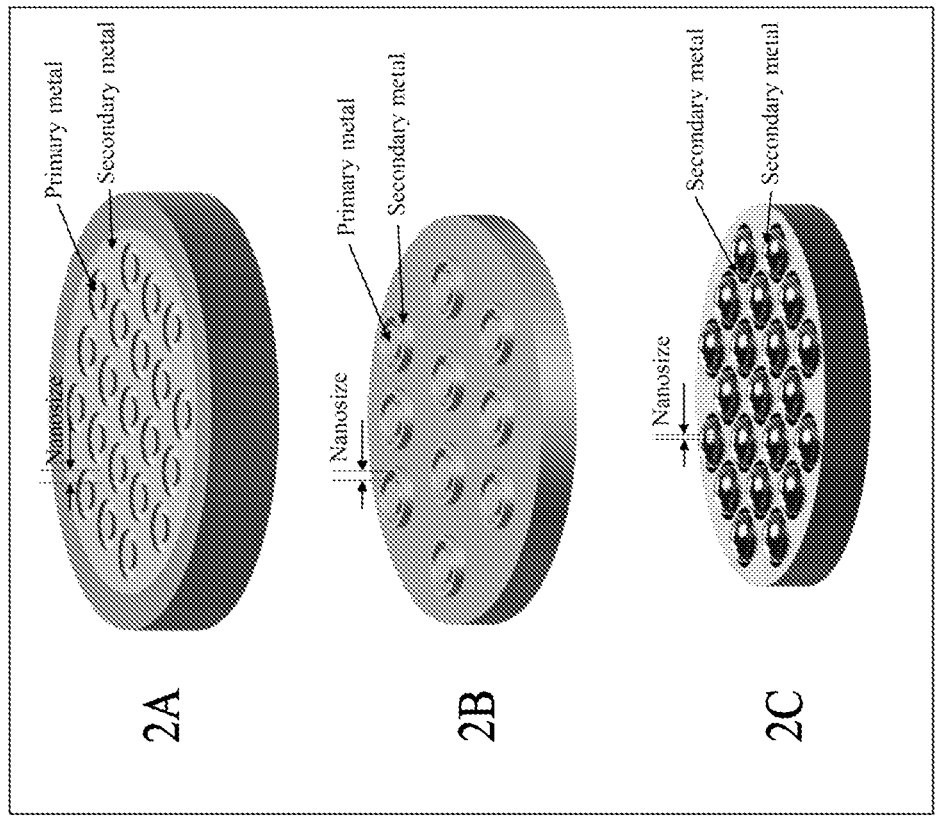

FIG. 2 is a diagram illustrating a nanogap structure on a cross-section of an optical fiber, according to an embodiment.

FIG. 2 illustrates an example of the nanogap structure on the cross-section of the optical fiber. According to an embodiment, any one of a concave ring structure 2A, a ring disk structure 2B, and a dome structure 2C, including a nanosized gap, may be on the cross-section of the optical fiber.

The concave ring structure 2A may be a structure including a concave ring that is as narrow as a nanosized gap between primary metal and secondary metal. The ring disk structure 2B may be a structure on which the secondary metal in a ring form is spaced apart by a nanosized gap from the primary metal in a disk form. The dome structure 2C may be a structure including domes on which the secondary metal is deposited. The domes on which the secondary metal is deposited in the dome structure 2C may be spaced apart by a nanosized gap from the secondary metal that is deposited around the domes.

According to an embodiment, a nanopattern may widely be on the cross-section of the optical fiber by masking hundreds of nm of 2D nanoparticles on the cross-section of the optical fiber. For example, various forms of nanogap structures may be manufactured by close-packing a bead including at least one of metal, oxide, and polymer. The concentration of a sensing target may be sensed based on a degree of scattering of light by the sensing target adhered to a nanogap structure on the cross-section of the optical fiber when the light incident on the optical fiber is totally reflected by a clad layer of the optical fiber and travels inside a core layer of the optical fiber. In other words, the concentration of the sensing target may be sensed by using incident light entering inside the optical fiber and reflected light scattered from the cross-section of the optical fiber by the nanogap structure.

The concave ring structure 2A may be mass-produced at a low cost through a batch process of nanosphere lithography. A nanosized gap may cause a hot spot effect. A grating effect may be expected because of a periodic arrangement.

The area of the secondary metal may decrease by forming a ring structure in the ring disk structure 2B compared to the concave ring structure 2A, and a background signal may decrease. The area of the secondary metal may decrease in the ring disk structure 2B compared to the concave ring structure 2A, and the area of signal collection may increase.

A sensing area increases in the dome structure 2C, and an electric field may increase in a broad area. An electric field may concentrate in a local area in the concave ring structure 2A and the ring disk structure 2B, but the electric field may concentrate in a broader area in the dome structure 2C compared to the concave ring structure 2A or the ring disk structure 2B.

Figure 3:
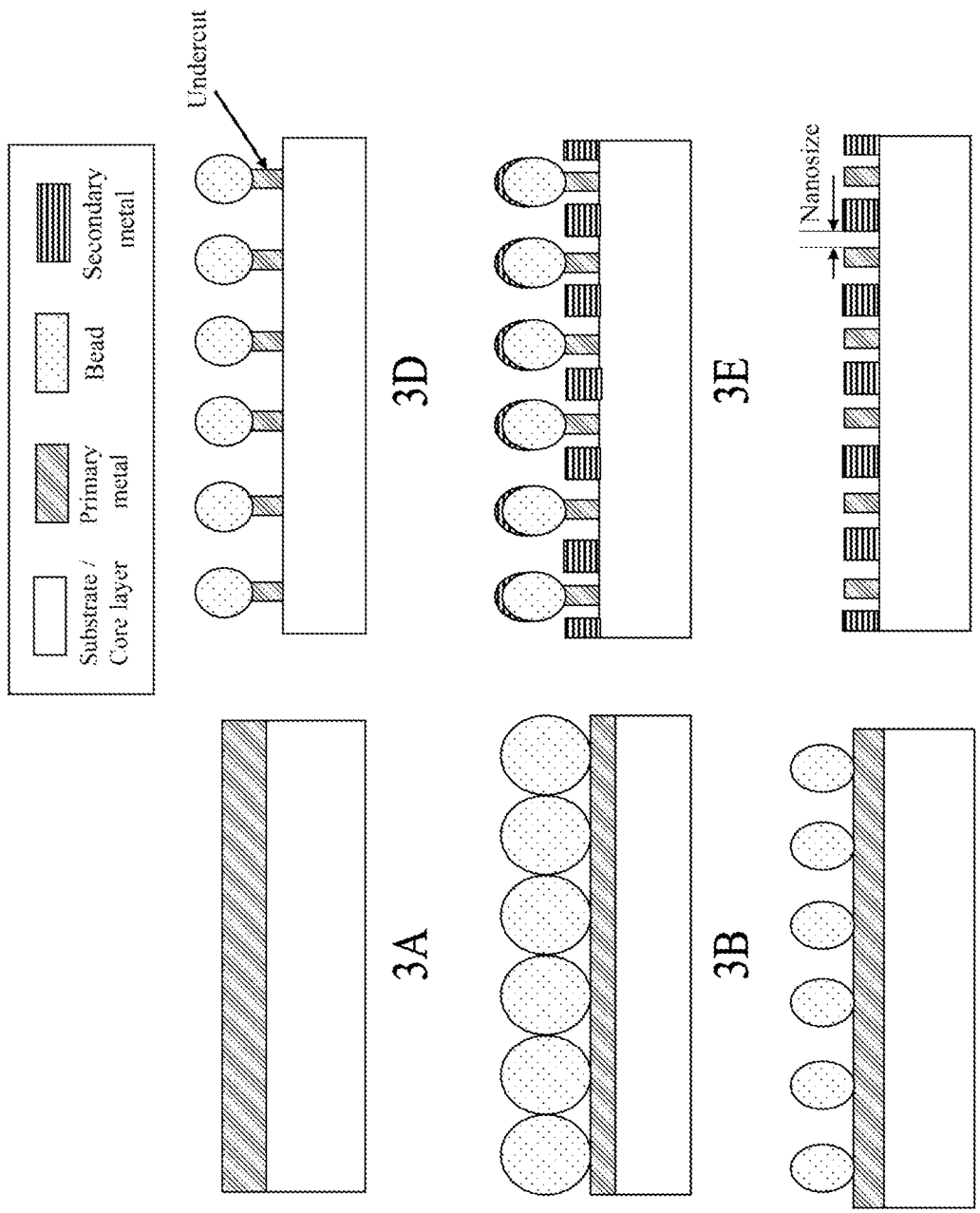
FIG. 3 is a diagram illustrating a method of manufacturing a ring structure including a nanogap by using undercut, according to an embodiment.

FIG. 3 is a diagram illustrating a method of manufacturing a ring structure including a nanogap by using undercut, according to an embodiment.

In operation 3A, primary metal is deposited on a surface of a substrate or a cross-section of a core layer of an optical fiber.

In operation 3B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 3C, the close-packed beads may be etched. With the beads etched, a gap of a certain size may be between the beads.

In operation 3D, the primary metal may be etched. When the primary metal is etched, the primary metal may be removed, and the surface of the substrate may be exposed by a gap between the beads. When the primary metal is etched by a gap between the beads, the primary metal may be in a disk form. According to an embodiment, after the primary metal is etched by a gap between the beads, undercut that additionally etches the primary metal may be applied to the primary metal. In other words, the undercut may be a process of over-etching the primary metal. In this case, a gap between primary metal at the lower end of the bead may be greater than a gap between the beads while undercut is performed. Then, the width of the primary metal at the lower end of the bead may be less than the width of the bead after the undercut. In other words, the diameter of the primary metal in a disk form, which is as narrow as the width of the bead, may decrease due to the undercut.

Then, a nanosized gap may be between the primary metal and the secondary metal, in which the primary metal is etched by applying undercut to the primary metal at the lower end of the bead. The nanosized gap may vary depending on how much the primary metal is additionally etched through undercut compared to the width of the bead. For example, the width of the primary metal further decreases compared to the width of the bead as the primary metal is further etched through undercut. In other words, a nanosized gap between the secondary metal deposited between the beads and the primary metal at the lower end of the bead increases as the primary metal is further etched.

In operation 3E, the secondary metal may be deposited on the upper end of the bead and to the surface of the substrate or the cross-section of the core layer of the optical fiber by a gap between beads.

In operation 3F, the bead may be removed. A concave ring structure, such as the concave ring structure 1A or 2A, including the primary metal and the secondary metal may be formed. In this case, a ring as narrow as a nanosized gap may be between the primary metal and the secondary metal.

In this case, the nanosized gap may be adjusted by applying undercut to the primary metal at the lower end of the bead. In other words, the nanosized gap may vary depending on how much the primary metal is excessively etched through undercut. For example, the nanosized gap between the primary metal and the secondary metal in the concave ring structure may increase as a degree of additional etching of the primary metal increases after the primary metal at the lower end of the bead is etched through undercut up to the width of the bead. In other words, the width of the ring between the primary metal and the secondary metal may increase when the primary metal is further excessively etched through undercut.

The process described with reference to FIG. 3 may adjust a nanosized gap in the concave ring structure 1A or 2A illustrated in FIGS. 1 and 2 by adjusting a degree of undercut. The nanosized gap may increase as a degree of etching the primary metal at the lower end of the bead through undercut increases.

In FIG. 3, the primary metal and the secondary metal may include the same material or different materials. The primary metal and the secondary metal may include at least one of gold (Au), silver (Ag), and other metal.

Figure 4:
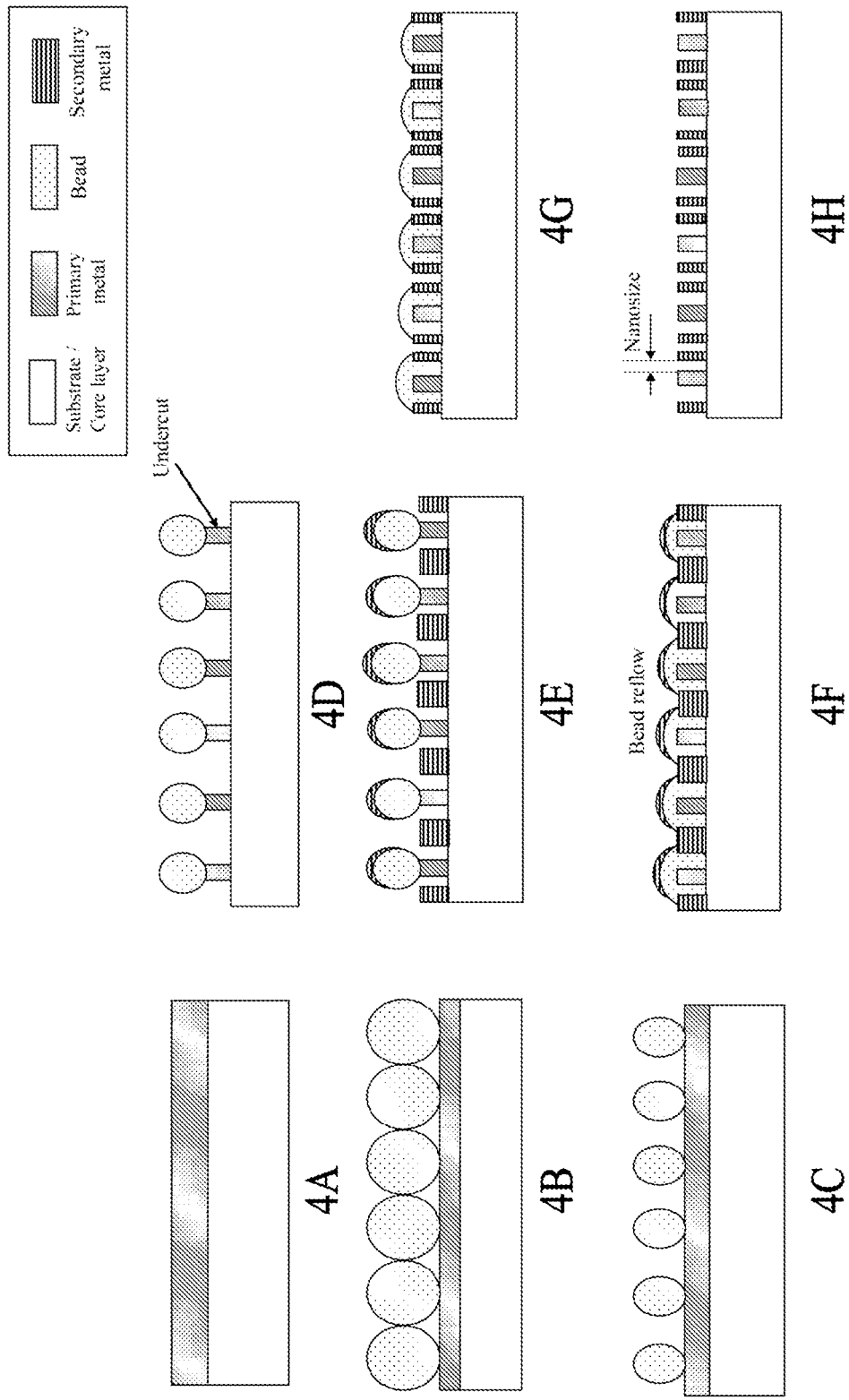
FIG. 4 is a diagram illustrating a method of manufacturing a ring disk structure including a nanogap by using undercut, according to an embodiment.

FIG. 4 is a diagram illustrating a method of manufacturing a ring disk structure including a nanogap by using undercut, according to an embodiment.

In operation 4A, primary metal is deposited on a surface of a substrate or a cross-section of a core layer of an optical fiber.

In operation 4B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 4C, the close-packed beads may be etched. With the beads etched, a gap of a certain size may be between the beads.

In operation 4D, the primary metal may be etched. When the primary metal is etched, the primary metal may be removed, and the surface of the substrate may be exposed by a gap between the beads. When the primary metal is etched by a gap between the beads, the primary metal may be in a disk form. According to an embodiment, after the primary metal is etched by a gap between the beads, undercut that additionally etches the primary metal may be applied to the primary metal. In other words, the undercut may be a process of over-etching the primary metal. In this case, a gap between primary metal at the lower end of the bead may be greater than a gap between the beads while undercut is performed. Then, the width of the primary metal at the lower end of the bead may be less than the width of the bead after the undercut. In other words, the diameter of the primary metal in a disk form, which is as narrow as the width of the bead, may decrease due to the undercut.

Then, a nanosized gap may be between the primary metal and the secondary metal, in which the primary metal is etched by applying undercut to the primary metal at the lower end of the bead. The nanosized gap may vary depending on how much the primary metal is additionally etched through undercut compared to the width of the bead. For example, the width of the primary metal further decreases compared to the width of the bead as the primary metal is further etched through undercut. In other words, a nanosized gap between the secondary metal deposited between the beads and the primary metal at the lower end of the bead increases as the primary metal is further etched.

In operation 4E, the secondary metal may be deposited on the upper end of the bead and to the surface of the substrate or the cross-section of the core layer of the optical fiber by a gap between beads.

In operation 4F, bead reflow may be performed. The bead reflow may be a process of applying heat to a bead and melting the bead such that the bead may flow in both directions. A bead in a spherical form may be melted through bead reflow and may fill the gap between the primary metal and the secondary metal. The gap between beads may decrease as the time of bead reflow increases. The secondary metal exposed to the outside may decrease as a gap between the beads on a surface of the secondary metal decreases.

In operation 4G, the secondary metal may be etched. The secondary metal deposited on the upper end of the bead and the secondary metal between the gap between the beads that is decreased by the bead reflow may be etched. In this case, the secondary metal may be etched by the gap between the beads that is decreased by the bead reflow, and a gap may be formed in the secondary metal.

In operation 4H, the bead may be removed. A ring disk structure, such as the ring disk structure 1B or 2B of FIGS. 1 and 2, including the primary metal and the secondary metal, may be formed. With the bead removed, the primary metal in a disk form may be in the center of the ring disk structure and the secondary metal in a ring form may be around the primary metal, forming the ring disk structure. In this case, the secondary metal in a ring form may be spaced apart by a nanosized gap from the primary metal in a disk form.

In this case, the nanosized gap may be adjusted by applying undercut to the primary metal at the lower end of the bead. In other words, the nanosized gap may vary depending on how much the primary metal is excessively etched through undercut. For example, the nanosized gap between the primary metal and the secondary metal in the ring disk structure may increase as a degree of additional etching of the primary metal increases after the primary metal at the lower end of the bead is etched through undercut up to the width of the bead. In other words, the nanosized gap between the primary metal and the secondary metal may increase when the primary metal is further excessively etched through undercut.

The process described with reference to FIG. 4 may adjust a nanosized gap in the ring disk structure 1B or 2B illustrated in FIGS. 1 and 2 by adjusting a degree of undercut. The nanosized gap may increase as a degree of etching the primary metal at the lower end of the bead through undercut increases.

In addition, the width of the secondary metal in a ring form in the ring disk structure may vary depending on a degree of bead flow through bead reflow. The bead flow may increase as the time of bead reflow increases, and a gap between the beads may decrease. In other words, a degree of etching of the secondary metal between the gap between the beads may decrease as the time of bead reflow increases. In operation 4G, because the secondary metal may be etched by the gap between the beads, the width of a ring formed of the secondary metal may increase as the time of bead reflow increases, and the gap between rings formed of the secondary metal may decrease. Conversely, the width of the ring formed of the secondary metal may decrease as the time of bead reflow decreases, and the gap between the rings formed of the secondary metal may increase.

In FIG. 4, the primary metal and the secondary metal may include the same material or different materials. The primary metal and the secondary metal may include at least one of gold, silver, and other metal.

Figure 5:
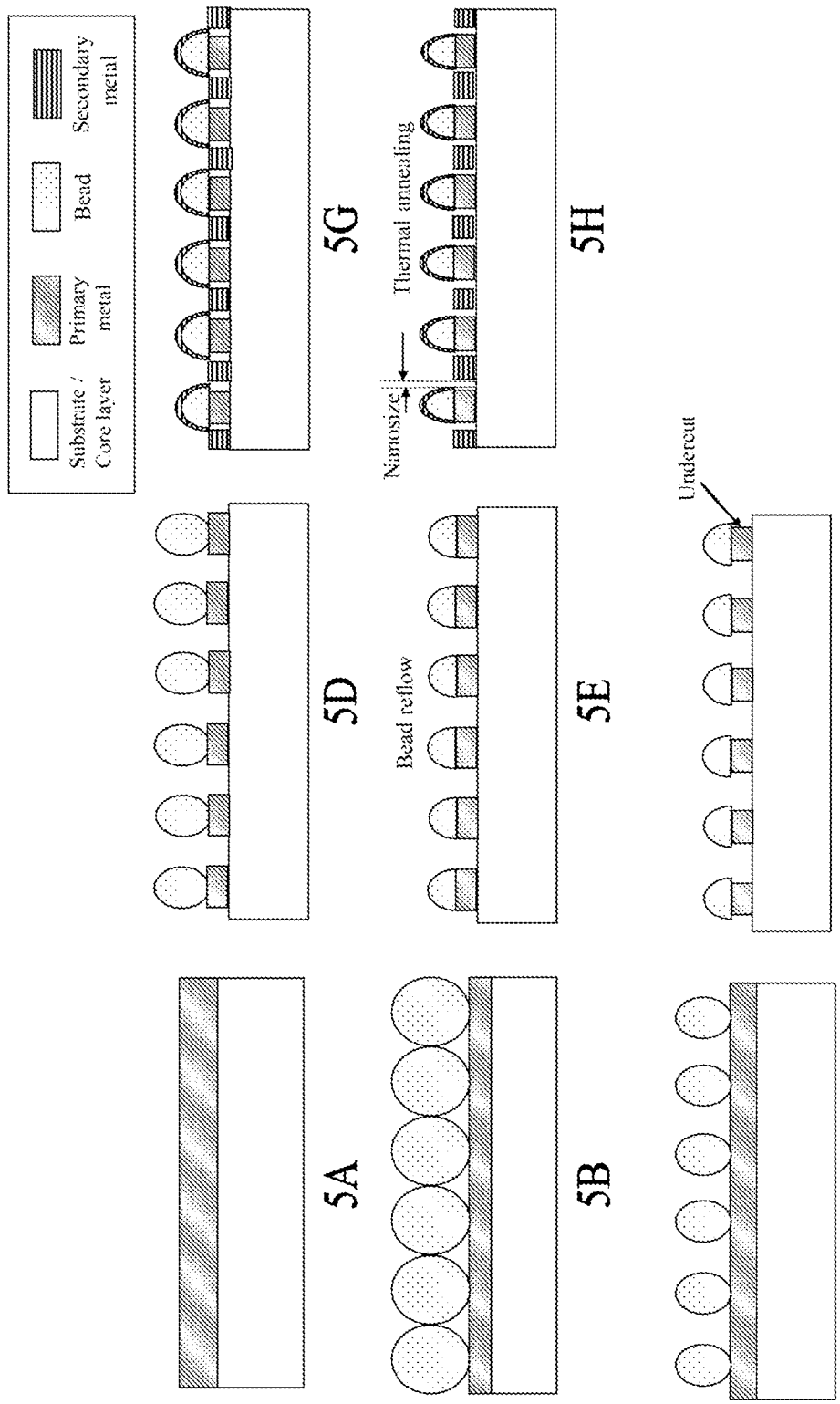
FIG. 5 is a diagram illustrating a method of manufacturing a dome structure including a nanogap by using undercut, according to an embodiment.

FIG. 5 is a diagram illustrating a method of manufacturing a dome structure including a nanogap by using undercut, according to an embodiment.

In operation 5A, primary metal is deposited on a surface of a substrate or a cross-section of a core layer of an optical fiber.

In operation 5B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 5C, the close-packed beads may be etched. With the beads etched, a gap of a certain size may be between the beads.

In operation 5D, the primary metal may be etched. With the primary metal etched, the primary metal may have the width of the bead. When the primary metal is etched, the primary metal as narrow as the gap between the beads may be removed and the surface of the substrate or the cross-section of the core layer of the optical fiber may be exposed.

In operation 5E, bead reflow may be performed. The bead reflow may be performed as narrow as the width of the primary metal at the lower end of the bead. A bead may be in a dome form through bead reflow.

In operation 5F, undercut may be performed on the primary metal. The primary metal may be etched as narrow as the width of the bead in operation 5D, and the primary metal may be additionally etched through undercut in operation 5F. Accordingly, the width of the primary metal at the lower end of the bead may be less than the width of the bead. In other words, the undercut may be a process of over-etching the primary metal. In this case, a gap between primary metal at the lower end of the bead may be greater than a gap between the beads while undercut is performed. Then, the width of the primary metal at the lower end of the bead may be less than the width of the bead after the undercut. In other words, the diameter of the primary metal in a disk form, which is as narrow as the width of the bead, may decrease due to the undercut.

In operation 5G, the secondary metal may be deposited on the upper end of the bead and the surface of the substrate by the gap between the beads.

In operation 5H, thermal annealing may be performed. The thermal annealing may be a process of applying heat to a bead, and then cooling the bead. The width of the bead may be reduced up to the width of the primary metal through thermal annealing. Through the thermal annealing, a nanosized gap may be between the primary metal at the lower end of the bead and the secondary metal. In addition, the height and width of a dome may be changed through thermal annealing. The secondary metal may be deposited on the surface of the dome.

In this case, the nanosized gap may be adjusted by applying undercut to the primary metal at the lower end of the bead. In other words, the nanosized gap may vary depending on how much the primary metal is excessively etched through undercut. For example, a nanosized gap between the dome on which the secondary metal is deposited and the secondary metal deposited around the dome in a dome structure may increase as a degree of additional etching, through undercut, of the primary metal at the lower end of the bead after being etched as narrow as the width of the bead increases. In other words, the nanosized gap between the dome on which the secondary metal is deposited and the secondary metal deposited around the dome may increase when the primary metal is further excessively etched through undercut.

The process described with reference to FIG. 5 may adjust a nanosized gap in the dome structure 1C or 2C illustrated in FIGS. 1 and 2 by adjusting a degree of undercut. The nanosized gap may increase as a degree of etching the primary metal at the lower end of the bead through undercut increases.

In FIG. 5, the primary metal and the secondary metal may include the same material or different materials. The primary metal and the secondary metal may include at least one of gold, silver, and other metal.

Figure 6:
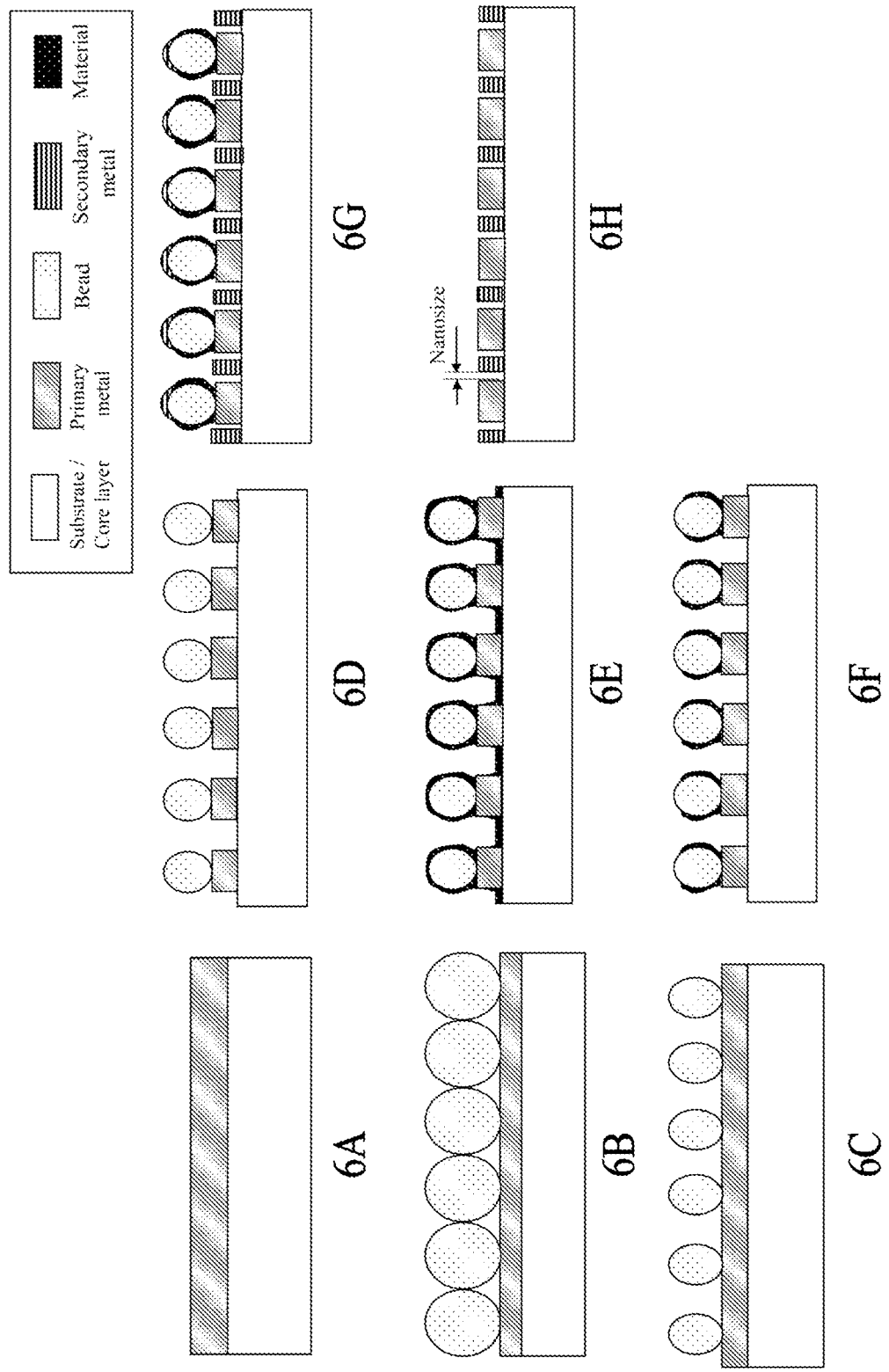
FIG. 6 is a diagram illustrating a method of manufacturing a ring structure including a nanogap by using a material, according to an embodiment.

FIG. 6 is a diagram illustrating a method of manufacturing a ring structure including a nanogap by using a material, according to an embodiment.

In operation 6A, primary metal is deposited on a surface of a substrate or a cross-section of a core layer of an optical fiber.

In operation 6B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 6C, the close-packed beads may be etched. With the beads etched, a gap of a certain size may be between the beads.

In operation 6D, the primary metal may be etched. With the primary metal etched, a gap, corresponding to the gap between the beads, may be formed in the primary metal. When the primary metal is etched, the primary metal may be removed, and the surface of the substrate may be exposed by a gap between the beads. When the primary metal is etched by a gap between the beads, the primary metal may be in a disk form.

In operation 6E, a material may coat the surface of the bead and may coat the surface of the substrate or the core layer of the optical fiber, which is exposed when the primary metal is etched. The material may include materials different from those of the primary metal and the secondary metal. The material may be oxide, for example, $SiO_2$ or $Al_2O_3$.

In operation 6F, the material may be anisotropically etched. The material coating the surface of the substrate or the core layer of the optical fiber may be removed through anisotropic etching and the material coating an upper end of the bead may be removed. A material coating a side surface of the bead may be maintained.

In operation 6G, the secondary metal may be deposited. The secondary metal may be deposited to the surface of the substrate or the core layer of the optical fiber by a gap between materials respectively coating an upper end of the bead and the side surface of the bead.

In operation 6H, the bead may be removed. Then, a concave ring structure, such as the concave ring structure 1A or 2A, including the primary metal and the secondary metal may be formed. The primary metal may be in a disk form. In this case, a nanosized gap may be between the primary metal and the secondary metal.

In this case, the nanosized gap may vary depending on a degree of coating of the material on the side surface of the bead. The width of the secondary metal may decrease as the width of the material coating the side surface of the bead increases. The nanosized gap between the primary metal and the secondary metal may increase as the width of the material coating the side surface of the bead increases.

The process described with reference to FIG. 6 may adjust a nanosized gap in the concave ring structure 1A or 1B illustrated in FIGS. 1 and 2 by adjusting a degree of coating of the material. The nanosized gap may increase as the thickness of coating of the material increases.

In FIG. 6, the primary metal and the secondary metal may include the same material or different materials. The primary metal and the secondary metal may include at least one of gold, silver, and other metal.

Figure 7:
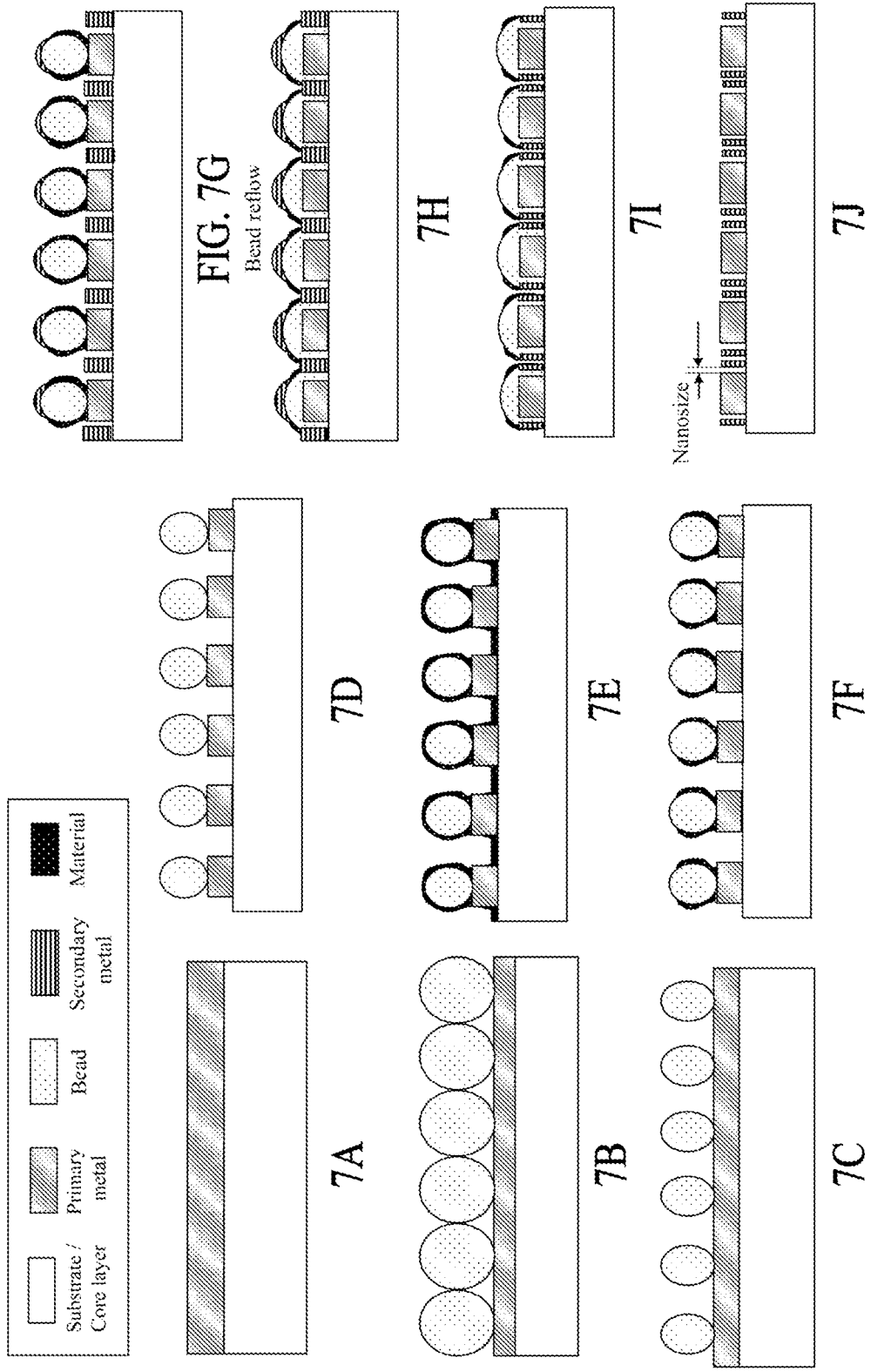
FIG. 7 is a diagram illustrating a method of manufacturing a ring disk structure with a nanogap by using a material, according to an embodiment.

FIG. 7 is a diagram illustrating a method of manufacturing a ring disk structure with a nanogap by using a material, according to an embodiment.

In operation 7A, primary metal is deposited on a surface of a substrate or a cross-section of a core layer of an optical fiber.

In operation 7B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 7C, the close-packed beads may be etched. With the beads etched, a gap of a certain size may be between the beads.

In operation 7D, the primary metal may be etched. With the primary metal etched, a gap, corresponding to the gap between the beads, may be formed in the primary metal. When the primary metal is etched, the primary metal may be removed, and the surface of the substrate may be exposed by a gap between the beads. When the primary metal is etched by a gap between the beads, the primary metal may be in a disk form.

In operation 7E, a material may coat the surface of the bead and may coat the surface of the substrate or the core layer of the optical fiber, which is exposed when the primary metal is etched. The material may include materials different from those of the primary metal and the secondary metal. The material may be oxide, for example, $SiO_2$ or $Al_2O_3$.

In operation 7F, the material may be anisotropically etched. The material coating the surface of the substrate or the core layer of the optical fiber may be removed through anisotropic etching and the material coating an upper end of the bead may be removed. A material coating a side surface of the bead may be maintained.

In operation 7G, the secondary metal may be deposited. The secondary metal may be deposited to the surface of the substrate or the core layer of the optical fiber by a gap between materials respectively coating an upper end of the bead and the side surface of the bead.

In operation 7H, reflow may be performed on the bead. The gap between the materials coating the side surface of the bead may decrease as the reflow is performed on the bead and the bead spreads laterally.

In operation 7I, the secondary metal may be etched. The secondary metal deposited on the upper end of the bead and the secondary metal exposed by a gap between the materials coating the side surface of the bead may be removed.

In operation 7J, the bead may be removed. A ring disk structure, such as the ring disk structure 1B or 2B of FIGS. 1 and 2, including the primary metal and the secondary metal, may be formed. With the bead removed, the primary metal in a disk form may be in the center of the ring disk structure and the secondary metal in a ring form may be around the primary metal, forming the ring disk structure. In this case, the secondary metal in a ring form may be spaced apart by a nanosized gap from the primary metal in a disk form.

In this case, the nanosized gap may vary depending on a degree of coating of the material on the side surface of the bead. The width of the secondary metal deposited on the substrate or the core layer of the optical fiber, which is exposed by a gap between the materials, may decrease as the thickness of the material coating the side surface of the bead increases. The nanosized gap between the primary metal and the secondary metal may increase as the width of the material coating the side surface of the bead increases.

In addition, the width of the secondary metal in a ring form in the ring disk structure may vary depending on a degree of bead flow through bead reflow. The bead flow may increase as the time of bead reflow increases, and a gap between the beads may decrease. In other words, a degree of etching of the secondary metal between the gap between the beads may decrease as the time of bead reflow increases. In operation 7I, because the secondary metal may be etched by the gap between the beads, the width of a ring formed of the secondary metal may increase as the time of bead reflow increases, and the gap between rings formed of the secondary metal may decrease. Conversely, the width of the ring formed of the secondary metal may decrease as the time of bead reflow decreases, and the gap between the rings formed of the secondary metal may increase.

The process described with reference to FIG. 7 may adjust a nanosized gap in the ring disk structure 1B or 2B illustrated in FIGS. 1 and 2 by adjusting a degree of coating of the material. The nanosized gap between the primary metal and the secondary metal may increase as the thickness of coating of the material increases.

In FIG. 7, the primary metal and the secondary metal may include the same material or different materials. The primary metal and the secondary metal may include at least one of gold, silver, and other metal.

Figure 8:
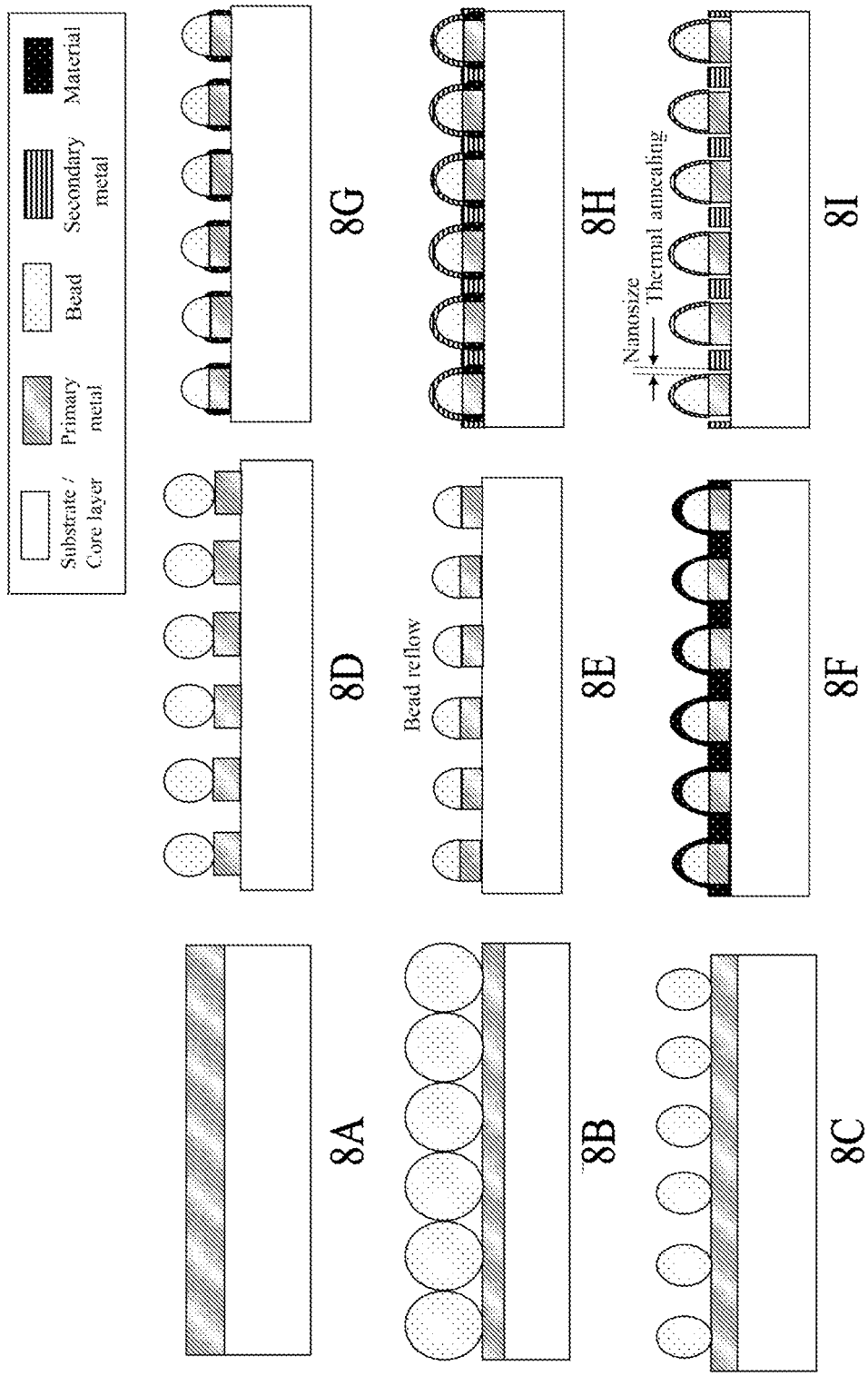
FIG. 8 is a diagram illustrating a method of manufacturing a dome structure including a nanogap by using a material, according to an embodiment.

FIG. 8 is a diagram illustrating a method of manufacturing a dome structure including a nanogap by using a material, according to an embodiment.

In operation 8A, primary metal is deposited on a surface of a substrate or a cross-section of a core layer of an optical fiber.

In operation 8B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 8C, the close-packed beads may be etched. With the beads etched, a gap of a certain size may be between the beads.

In operation 8D, the primary metal may be etched. With the primary metal etched, the primary metal may have the width of the gap between the beads. When the primary metal is etched, the primary metal as narrow as the gap between the beads may be removed and the surface of the substrate or the cross-section of the core layer of the optical fiber may be exposed.

In operation 8E, bead reflow may be performed. The bead reflow may be performed as narrow as the width of the primary metal at the lower end of the bead. A bead may be in a dome form through bead reflow.

In operation 8F, a material may coat the surface of the bead and may coat the surface of the substrate or the core layer of the optical fiber, which is exposed when the primary metal is etched. The material may include materials different from those of the primary metal and the secondary metal. The material may be oxide, for example, $SiO_2$ or $Al_2O_3$.

In operation 8G, the material may be anisotropically etched. The material coating the surface of the substrate or the core layer of the optical fiber may be removed through anisotropic etching and the material coating an upper end of the bead may be removed. A material coating a side surface of the bead may be maintained.

In operation 8H, the secondary metal may be deposited. The secondary metal may be deposited to the surface of the substrate or the core layer of the optical fiber by a gap between materials respectively coating an upper end of the bead and the side surface of the bead.

In operation 8I, thermal annealing and etching of the material may be performed. The thermal annealing may be a process of applying heat to a bead, and then cooling the bead. The width of the bead may be reduced up to the width of the primary metal through thermal annealing. Through the thermal annealing and the etching of the material, a nanosized gap may be between the primary metal at the lower end of the bead and the secondary metal. In addition, the height and width of a dome may be changed through thermal annealing. The secondary metal may be deposited on the surface of the dome.

In this case, the nanosized gap may vary depending on a degree of coating of the material on the side surface of the bead. The width of the secondary metal deposited on the substrate or the core layer of the optical fiber, which is exposed by a gap between the materials, may decrease as the thickness of the material coating the side surface of the bead increases. The nanosized gap between the primary metal and the secondary metal may increase as the width of the material coating the side surface of the bead increases.

The process described with reference to FIG. 8 may adjust a nanosized gap in the dome structure 1C or 2C illustrated in FIGS. 1 and 2 by adjusting a degree of coating of the material. The nanosized gap may increase as the thickness of coating of the material increases.

In FIG. 8, the primary metal and the secondary metal may include the same material or different materials. The primary metal and the secondary metal may include at least one of gold, silver, and other metal.

Figure 9:
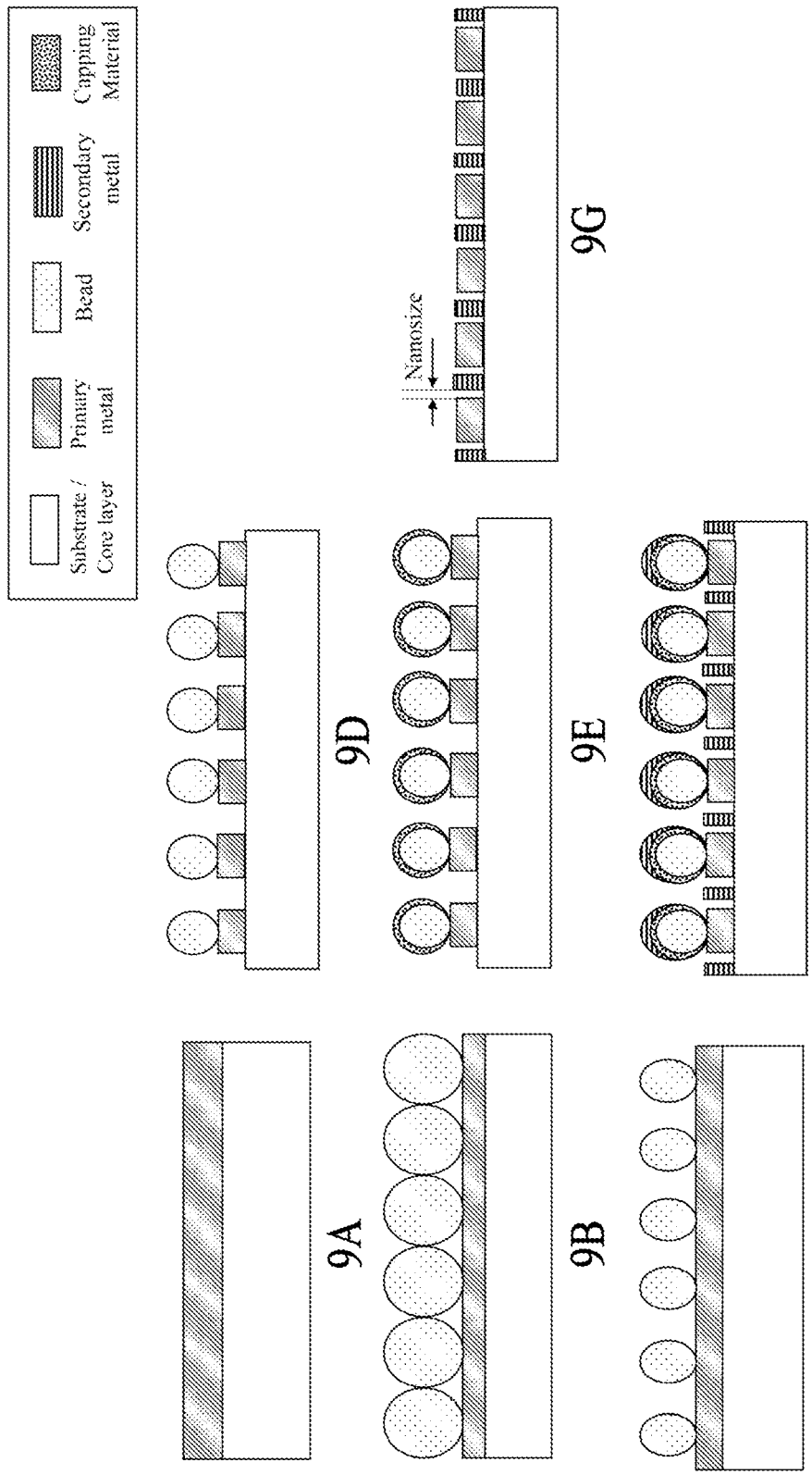
FIG. 9 is a diagram illustrating a method of manufacturing a ring structure including a nanogap by using bead capping, according to an embodiment.

FIG. 9 is a diagram illustrating a method of manufacturing a ring structure including a nanogap by using bead capping, according to an embodiment.

In operation 9A, primary metal is deposited on a surface of a substrate or a cross-section of a core layer of an optical fiber.

In operation 9B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 9C, the close-packed beads may be etched. With the beads etched, a gap of a certain size may be between the beads.

In operation 9D, the primary metal may be etched. With the primary metal etched, a gap, corresponding to the gap between the beads, may be formed in the primary metal. When the primary metal is etched, the primary metal may be removed, and the surface of the substrate may be exposed by a gap between the beads. When the primary metal is etched by a gap between the beads, the primary metal may be in a disk form.

In operation 9E, the bead may be capped by a capping material. The gap between the beads may be adjusted according to the thickness of the capping material capping the surface of the bead. Capping may be a process of processing a capping material such that the capping material may surround a bead. The capping may be chemical growth of a capping material selectively on a bead that is a seed. The capping material may not be coated on or attached to the surroundings other than the bead. For example, the gap between the beads may decrease as the thickness of the capping material increases.

In operation 9F, the secondary metal may be deposited on the upper end of the capping material attached to the surface of the bead and may be deposited on the surface of the substrate or the core layer of the optical fiber, which is exposed by the gap between the beads. The gap between the beads may decrease as the thickness of the capping material increases, and the second metal, as narrow as the decreased gap, may be deposited.

In operation 9G, the bead may be removed. Then, a concave ring structure, such as the concave ring structure 1A or 2A, including the primary metal and the secondary metal may be formed. In this case, a ring as narrow as a nanosized gap may be between the primary metal and the secondary metal.

In this case, the nanosized gap may vary depending on the thickness of a capping material attached to the beads. The gap between the beads may decrease as the thickness of the capping material applied to the beads increases. The width of the secondary metal deposited on the substrate or the core layer of the optical fiber, which is exposed between the beads, may decrease as the thickness of the capping material attached to the beads increases. The nanosized gap between the primary metal and the secondary metal may increase as the thickness of the capping material applied to the beads increases.

The process described with reference to FIG. 9 may adjust a nanosized gap in the concave ring structure 1A or 2A illustrated in FIGS. 1 and 2 by adjusting the thickness of a capping material applied to a bead. The nanosized gap may increase as the thickness of coating of the material increases.

In FIG. 9, the primary metal and the secondary metal may include the same material or different materials. The primary metal and the secondary metal may include at least one of gold, silver, and other metal.

Figure 10:
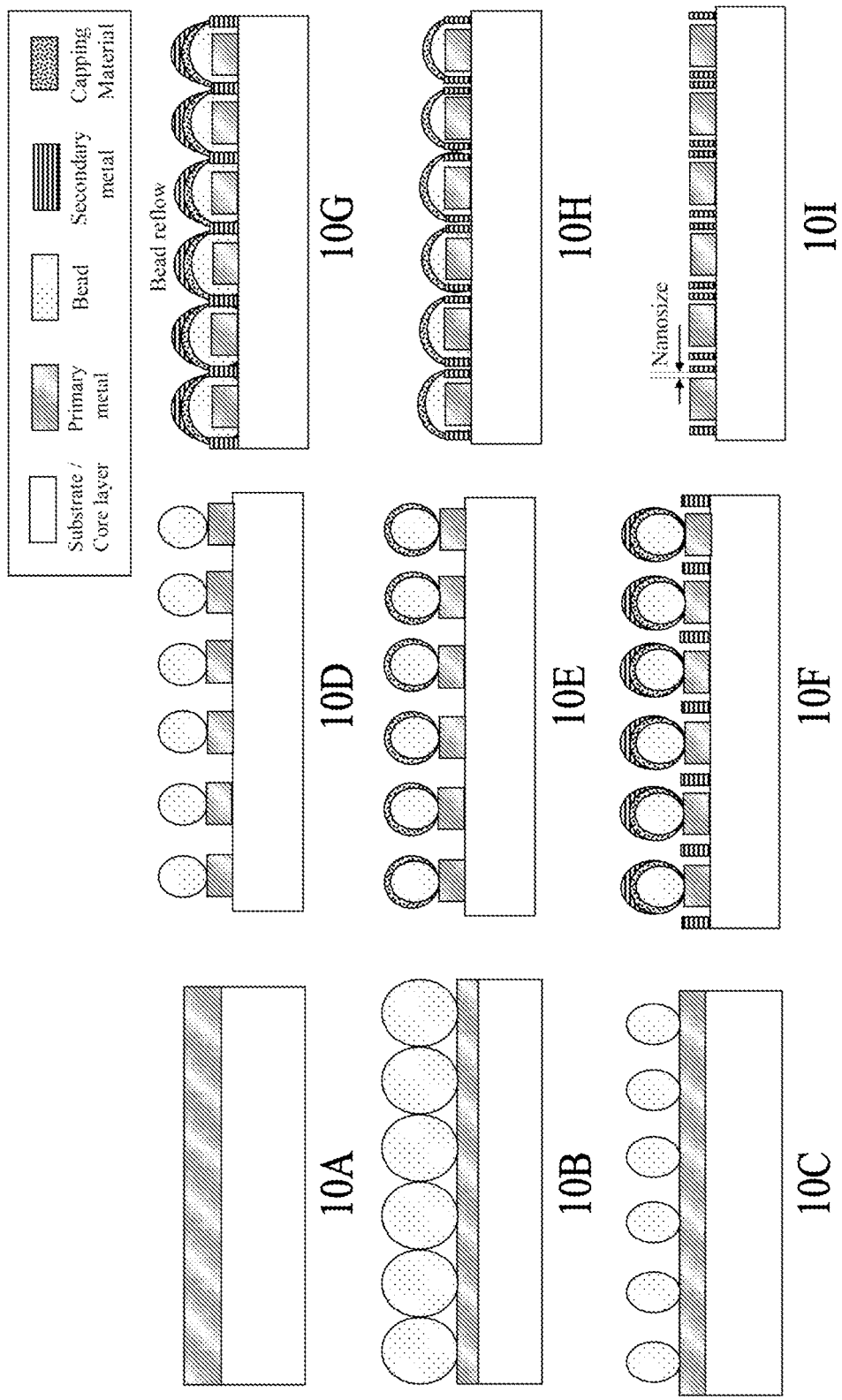
FIG. 10 is a diagram illustrating a method of manufacturing a ring disk structure including a nanogap by using bead capping, according to an embodiment.

FIG. 10 is a diagram illustrating a method of manufacturing a ring disk structure including a nanogap by using bead capping, according to an embodiment.

In operation 10A, primary metal is deposited on a surface of a substrate or a cross-section of a core layer of an optical fiber.

In operation 10B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 10C, the close-packed beads may be etched. With the beads etched, a gap of a certain size may be between the beads.

In operation 10D, the primary metal may be etched. With the primary metal etched, a gap, corresponding to the gap between the beads, may be formed in the primary metal. When the primary metal is etched, the primary metal may be removed, and the surface of the substrate may be exposed by a gap between the beads. When the primary metal is etched by a gap between the beads, the primary metal may be in a disk form.

In operation 10E, the bead may be capped by a capping material. The gap between the beads may be adjusted according to the thickness of the capping material capping the surface of the bead. For example, the gap between the beads may decrease as the thickness of the capping material increases.

In operation 10F, the secondary metal may be deposited on the upper end of the capping material attached to the surface of the bead and may be deposited on the surface of the substrate or the core layer of the optical fiber, which is exposed by the gap between the beads.

In operation 10G, the gap between the beads to which the capping material is applied may decrease as the reflow is performed on the beads and the beads spreads laterally. In other words, the gap between the beads may decrease as the time of bead reflow increases.

In operation 10H, the secondary metal may be etched. The secondary metal deposited on the upper end of the bead and the secondary metal exposed by a gap between the materials coating the side surface of the bead may be removed.

In operation 10I, the bead may be removed. Then, a ring disk structure, such as the ring disk structure 1B or 2B of FIGS. 1 and 2, including the primary metal and the secondary metal, may be formed. In this case, a nanosized gap may be between the primary metal and the secondary metal. With the bead removed, the primary metal in a disk form may be in the center of the ring disk structure and the secondary metal in a ring form may be around the primary metal, forming the ring disk structure. In this case, the secondary metal in a ring form may be spaced apart by a nanosized gap from the primary metal in a disk form.

In this case, the nanosized gap may vary depending on the thickness of a capping material applied to the beads. Then, the width of the secondary metal deposited on the substrate or the core layer of the optical fiber, which is exposed by the gap between the beads, may decrease as the thickness of the capping material applied to the beads increases. The nanosized gap between the primary metal and the secondary metal may increase as the thickness of the capping material applied to the beads increases.

In addition, the width of the secondary metal in a ring form in the ring disk structure may vary depending on a degree of bead flow through bead reflow. The bead flow may increase as the time of bead reflow increases, and a gap between the beads may decrease. In other words, a degree of etching of the secondary metal between the gap between the beads may decrease as the time of bead reflow increases. Then, because the secondary metal may be etched by the gap between the beads, the width of a ring formed of the secondary metal may increase as the time of bead reflow increases, and the gap between rings formed of the secondary metal may decrease. Conversely, the width of the ring formed of the secondary metal may decrease as the time of bead reflow decreases, and the gap between the rings formed of the secondary metal may increase.

The process described with reference to FIG. 10 may adjust a nanosized gap in the ring disk structure 1B or 2B illustrated in FIGS. 1 and 2 by adjusting the thickness of a capping material applied to a bead. The nanosized gap may increase as the thickness of the capping material applied to the beads increases.

In FIG. 10, the primary metal and the secondary metal may include the same material or different materials. The primary metal and the secondary metal may include at least one of gold, silver, and other metal.

Figure 11:
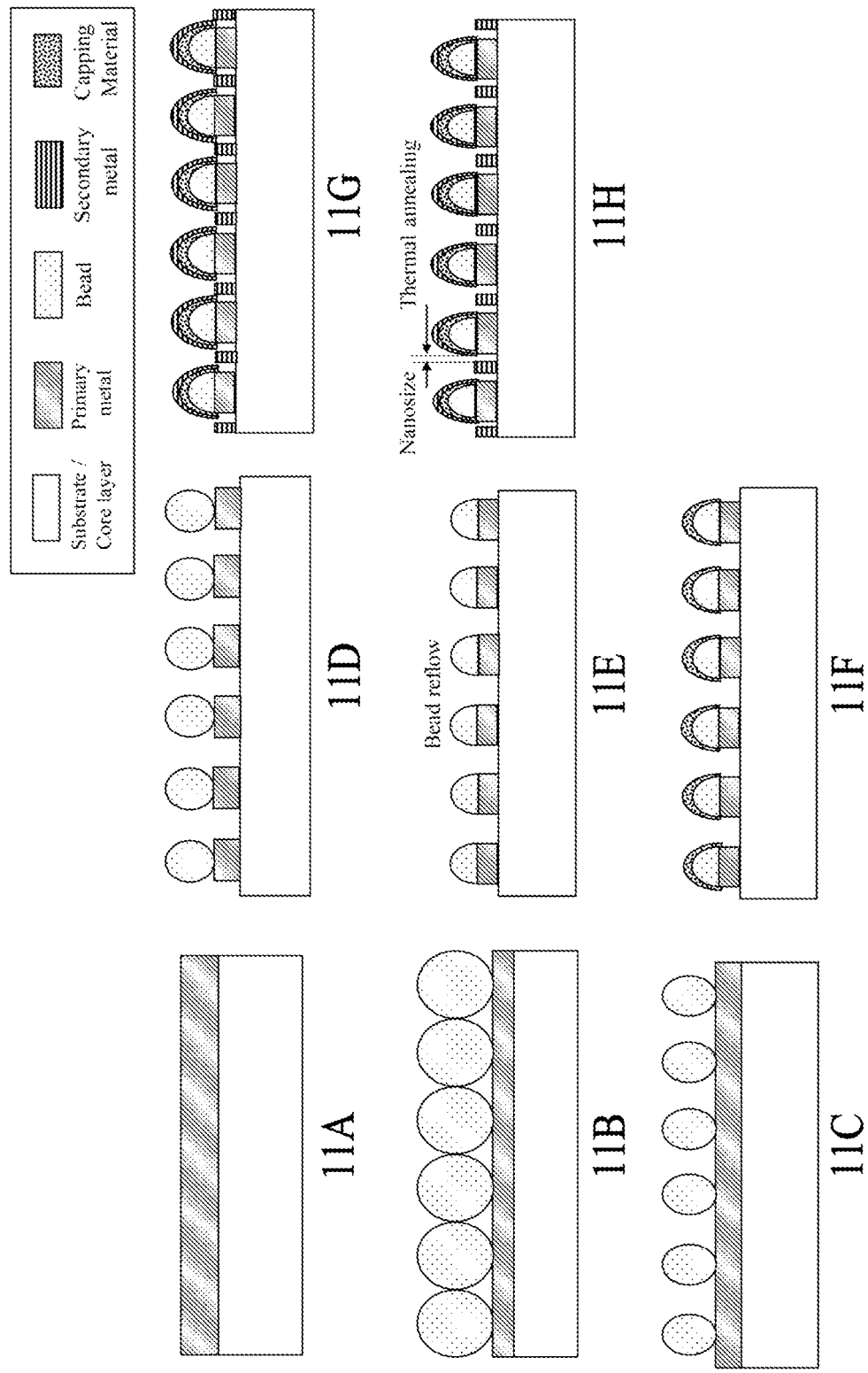
FIG. 11 is a diagram illustrating a method of manufacturing a dome structure including a nanogap by using bead capping, according to an embodiment.

FIG. 11 is a diagram illustrating a method of manufacturing a dome structure including a nanogap by using bead capping, according to an embodiment.

In operation 11A, primary metal is deposited on a surface of a substrate or a cross-section of a core layer of an optical fiber.

In operation 11B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 11C, the close-packed beads may be etched. With the beads etched, a gap of a certain size may be between the beads.

In operation 11D, the primary metal may be etched. With the primary metal etched, the primary metal may have the width of the gap between the beads. When the primary metal is etched, the primary metal as narrow as the gap between the beads may be removed and the surface of the substrate or the cross-section of the core layer of the optical fiber may be exposed.

In operation 11E, bead reflow may be performed. The bead reflow may be performed as narrow as the width of the primary metal at the lower end of the bead. A bead may be in a dome form through bead reflow.

In operation F, the bead may be capped by a capping material. The gap between the beads may be adjusted according to the thickness of the capping material capping the surface of the bead. For example, the gap between the beads may decrease as the thickness of the capping material increases.

In operation 11G, the secondary metal may be deposited on the upper end of the capping material attached to the surface of the bead and may be deposited on the surface of the substrate or the core layer of the optical fiber, which is exposed by the gap between the beads. The gap between the beads may decrease as the thickness of the capping material increases, and the second metal, as narrow as the decreased gap, may be deposited.

In operation 11H, thermal annealing may be performed. The thermal annealing may be a process of applying heat to a bead, and then cooling the bead. The size of the bead may be reduced up to the size of the primary metal through thermal annealing. Through the thermal annealing, a nanosized gap may be between the primary metal at the lower end of the reduced bead and the secondary metal. In addition, the height and width of a dome may be changed through thermal annealing. The secondary metal may be deposited on the surface of the dome.

The nanosized gap may vary depending on the thickness of a capping material applied to the beads. For example, the gap between the beads may decrease as the thickness of the capping material increases, and the width of the secondary metal deposited on the substrate or the core layer of the optical fiber, which is exposed by a gap between the capping materials as the gap between the beads decreases. In other words, the nanosized gap between the primary metal and the secondary metal may increase as the thickness of the capping material increases.

The process described with reference to FIG. 11 may adjust a nanosized gap in the dome structure 1C or 2C illustrated in FIGS. 1 and 2 by adjusting the thickness of a capping material applied to a bead. The nanosized gap may increase as the thickness of the capping material increases.

In FIG. 11, the primary metal and the secondary metal may include the same material or different materials. The primary metal and the secondary metal may include at least one of gold, silver, and other metal.

Figure 12:
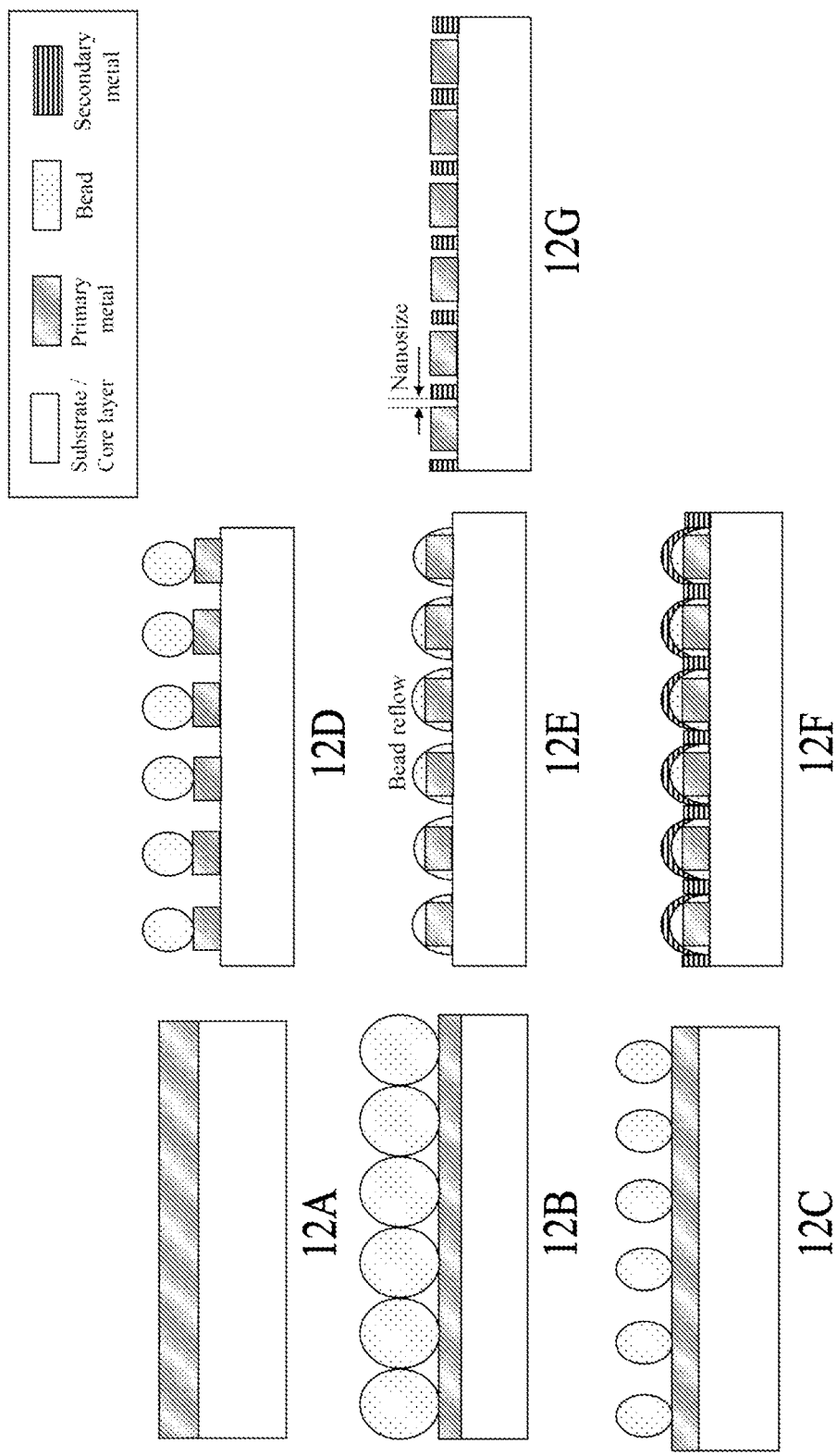
FIG. 12 is a diagram illustrating a method of manufacturing a ring structure including a nanogap by using bead reflow, according to an embodiment.

FIG. 12 is a diagram illustrating a method of manufacturing a ring structure including a nanogap by using bead reflow, according to an embodiment.

In operation 12A, primary metal is deposited on a surface of a substrate or a cross-section of a core layer of an optical fiber.

In operation 12B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 12C, the close-packed beads may be etched. With the beads etched, a gap of a certain size may be between the beads.

In operation 12D, the primary metal may be etched. With the primary metal etched, a gap, corresponding to the gap between the beads, may be formed in the primary metal. When the primary metal is etched, the primary metal may be removed, and the surface of the substrate may be exposed by a gap between the beads. When the primary metal is etched by a gap between the beads, the primary metal may be in a disk form.

In operation 12E, bead reflow may be performed. The gap between the beads may decrease as the bead reflow is performed and the beads spread laterally. The gap between the beads may decrease as the time of bead reflow increases.

In operation 12F, the secondary metal may be deposited on the upper end of the bead and may be deposited on the surface of the substrate or the core layer of the optical fiber, which is exposed by the gap between the beads. The gap between the beads may decrease as the time of bead reflow increases, and the second metal, as narrow as the decreased gap, may be deposited.

In operation 12G, the bead may be removed. Then, a concave ring structure, such as the concave ring structure 1A or 2A, including the primary metal and the secondary metal may be formed. In this case, a nanosized gap may be between the primary metal and the secondary metal.

The nanosized gap may vary depending on the time of bead reflow. The width of the secondary metal deposited on the surface of the substrate or the cross-section of the optical fiber, which is exposed through the gap between the beads, may decrease as the time of bead reflow increases. In other words, the nanosized gap between the primary metal and the secondary metal may increase as the time of bead reflow increases.

The process described with reference to FIG. 12 may adjust a nanosized gap in the concave ring structure 1A or 2A illustrated in FIGS. 1 and 2 by adjusting the time of bead reflow. The nanosized gap may increase as the time of bead reflow increases.

In FIG. 12, the primary metal and the secondary metal may include the same material or different materials. The primary metal and the secondary metal may include at least one of gold, silver, and other metal.

Figure 13:
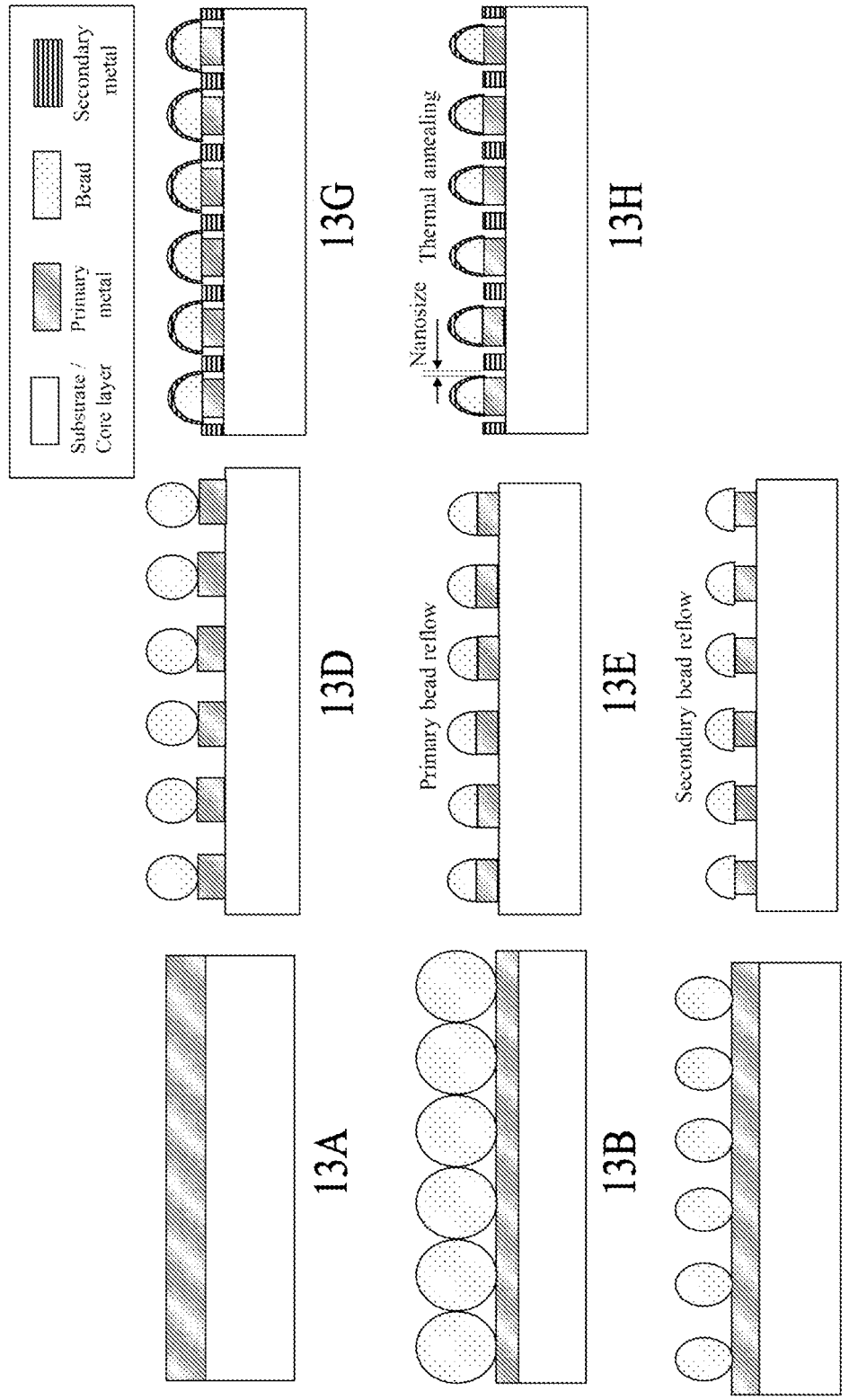
FIG. 13 is a diagram illustrating a method of manufacturing a dome structure including a nanogap by using bead reflow, according to an embodiment.

FIG. 13 is a diagram illustrating a method of manufacturing a dome structure including a nanogap by using bead reflow, according to an embodiment.

In operation 13A, primary metal is deposited on a surface of a substrate or a cross-section of a core layer of an optical fiber.

In operation 13B, a bead is close-packed on a surface of the deposited primary metal. For example, the bead may include at least one material of metal, oxide, and polymer. The bead, desirably, may include polystyrene. Close-packing may be a method of densely arranging beads such that there may be no gap between the beads.

In operation 13C, the close-packed beads may be etched. With the beads etched, a gap of a certain size may be between the beads.

In operation 13D, the primary metal may be etched. With the primary metal etched, a gap, corresponding to the gap between the beads, may be formed in the primary metal. When the primary metal is etched, the primary metal may be removed, and the surface of the substrate may be exposed by a gap between the beads.

In operation 13E, primary bead reflow may be performed. The primary bead reflow may be performed such that the bead may flow laterally as narrow as the width of the primary metal at the lower end of the bead. The bead may be in a dome form through the primary bead reflow.

In operation 13F, secondary bead reflow may be performed. The secondary bead reflow may be performed continuously when the primary bead reflow is finished or performed after a certain time passes. The bead in a dome form may further spread laterally by the width of the primary metal due to the secondary bead reflow. Then, the gap between the beads may further decrease through the secondary bead reflow compared to the primary bead reflow. The gap between the beads may vary depending on a time of the secondary bead reflow. The secondary bead reflow may derive a result similar to a result when undercut is performed such as in operation F of FIG. 5.

In operation 13G, the secondary metal may be deposited on the upper end of the bead and may be deposited on the surface of the substrate or the core layer of the optical fiber, which is exposed by the gap between the beads. The gap between the beads may decrease as the time of secondary bead reflow increases, and the second metal, as narrow as the decreased gap, may be deposited.

In operation 13H, thermal annealing may be performed. The thermal annealing may be a process of applying heat to a bead, and then cooling the bead. The width of the bead may be reduced up to the width of the primary metal through thermal annealing. Through the thermal annealing, a nanosized gap may be between the primary metal at the lower end of the bead and the secondary metal. In addition, the height and width of the dome formed through the primary bead reflow and the secondary bead reflow may be changed through the thermal annealing. The secondary metal may be deposited on the surface of the dome.

The nanosized gap may vary depending on the time of secondary bead reflow. For example, the gaps between the beads may decrease as the time of secondary bead reflow increases and the beads further spread laterally, and the width of the secondary metal to be deposited may also decrease as the gaps between the beads decreases. In other words, the nanosized gap between the primary metal and the secondary metal may increase as the time of secondary bead reflow increases.

The process described with reference to FIG. 13 may adjust a nanosized gap in the dome structure 1C or 2C illustrated in FIGS. 1 and 2 by adjusting the time of secondary bead reflow. The nanosized gap may increase as the time of secondary bead reflow increases.

In FIG. 13, the primary metal and the secondary metal may include the same material or different materials. The primary metal and the secondary metal may include at least one of gold, silver, and other metal.

Figure 14:
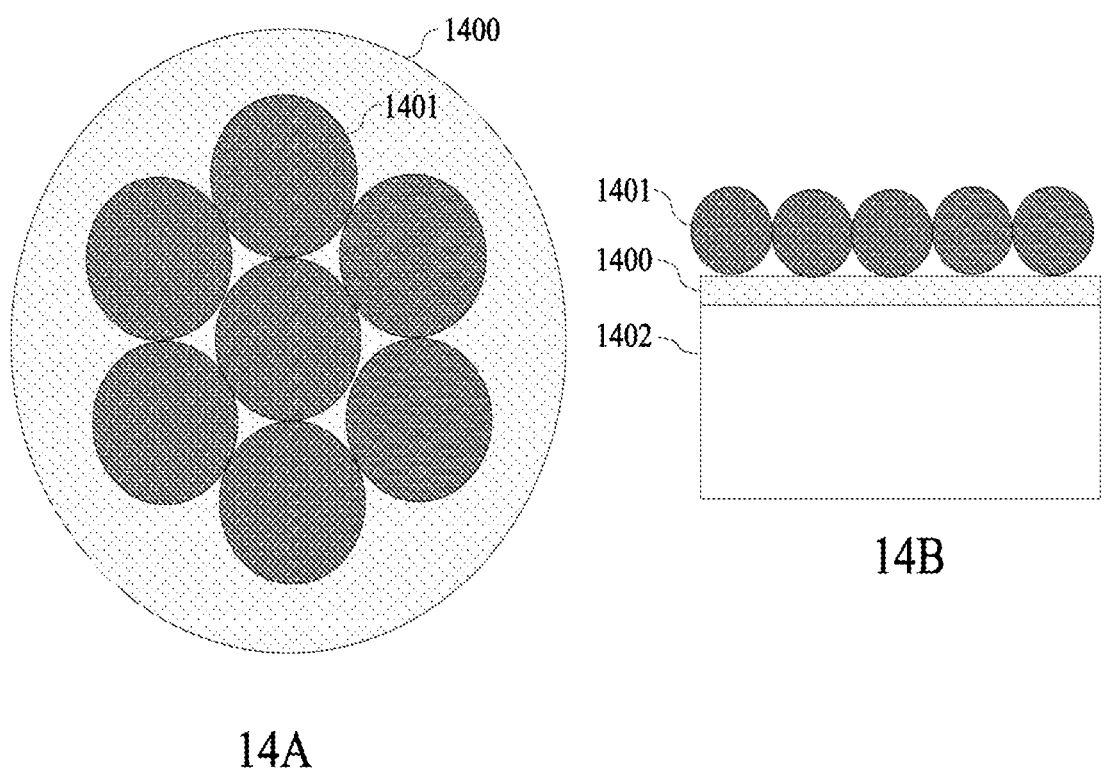
FIG. 14 is a diagram illustrating a first process of manufacturing a nanostructure including a disk and a mesh, according to an embodiment.

FIG. 14 is a diagram illustrating a first process of manufacturing a nanostructure including a disk and a mesh, according to an embodiment.

Referring to FIG. 14, illustrated are a plan view 14A and a cross-sectional view 14B that are related to the first process of manufacturing the nanostructure including the disk and the mesh.

Referring to the plan view 14A of FIG. 14, beads 1401 in a circular form may be close-packed on the upper end of a metal material 1400. The beads 1401 in a spherical form may face one another, not spaced apart from one another.

Referring to the cross-sectional view 14B of FIG. 14, the metal material 1400 may be deposited on the upper end of a substrate 1402, and on the upper end of the deposited metal material 1400, the beads 1401 in a spherical form may be close-packed. For example, the metal material 1400 may be a conductive material, such as gold and silver. The beads 1401 in a spherical form may be in a circular form in the plan view 14A.

Figure 15:
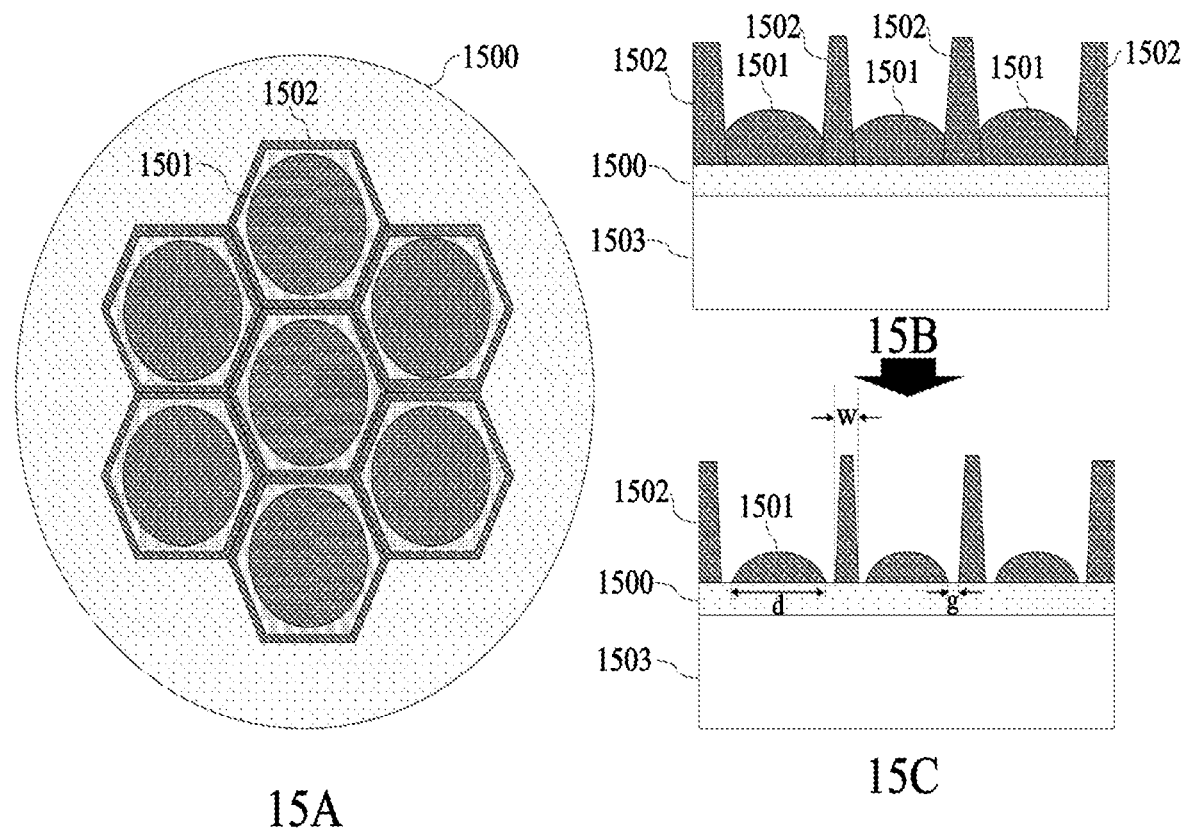
FIG. 15 is a diagram illustrating a second process of manufacturing a nanostructure including a disk and a mesh, according to an embodiment.

FIG. 15 is a diagram illustrating a second process of manufacturing a nanostructure including a disk and a mesh, according to an embodiment.

Referring to FIG. 15, illustrated are a plan view 15A and cross-sectional views 15B and 15C that are related to the second process of manufacturing the nanostructure including the disk and the mesh. The second process may be a process of applying reactive ion etching (RIE) to a result of a first process. In other words, FIG. 15 may be a result of repeatedly applying the RIE to the beads 1401 that are close-packed in FIG. 14.

Referring to the plan view 15A of FIG. 15, there may be a circular bead 1501 and a hexagonal bead 1502. The circular bead 1501 may be inside the hexagonal bead 1502. The hexagonal bead 1502 may be in a structure, such as a mesh. The circular bead 1501 may be spaced apart by a certain gap from the hexagonal bead 1502. In this case, the certain gap may correspond to g in the cross-sectional view 15C of FIG. 15.

The circular bead 1501 illustrated in the plan view 15A may be in a dome form in the cross-sectional views 15B and 15C of FIG. 15. The hexagonal bead 1502 illustrated in the plan view 15A may be in a pillar form in the cross-sectional views 15B and 15C of FIG. 15.

When the RIE is applied to the beads 1401 in a circular form in FIG. 14, the circular bead 1501 and the hexagonal bead 1502 may face each other, not spaced apart from each other, as illustrated in the cross-sectional view 15B of FIG. 15. The cross-sectional view 15B of FIG. 15 may be derived when the RIE is applied to the beads 1401 illustrated in the cross-sectional view 14B of FIG. 14.

When the RIE is additionally applied to a result as illustrated in the cross-sectional view 15B of FIG. 15, a result may be derived as illustrated in the cross-sectional view 15C of FIG. 15. The plan view 15A of FIG. 15 may correspond to the cross-sectional view 15C of FIG. 15. Referring to the cross-sectional view 15B of FIG. 15, the circular bead 1501 may face the hexagonal bead 1502, but as illustrated in the cross-sectional view 15C of FIG. 15, the circular bead 1501 may be spaced apart from the hexagonal bead 1502 with the RIE being additional applied.

Referring to the cross-sectional view 15C of FIG. 15, d may be a diameter of the circular bead 1501. Later, d may be a diameter of the disk included in the nanostructure. In addition, w may be the width of the hexagonal bead 1502. In addition, g may be a gap between the circular bead 1501 and the hexagonal bead 1502 and may have a nanosize in the nanostructure. As the time of applying the RIE increases, w and d may decrease and g may increase.

Figure 16:
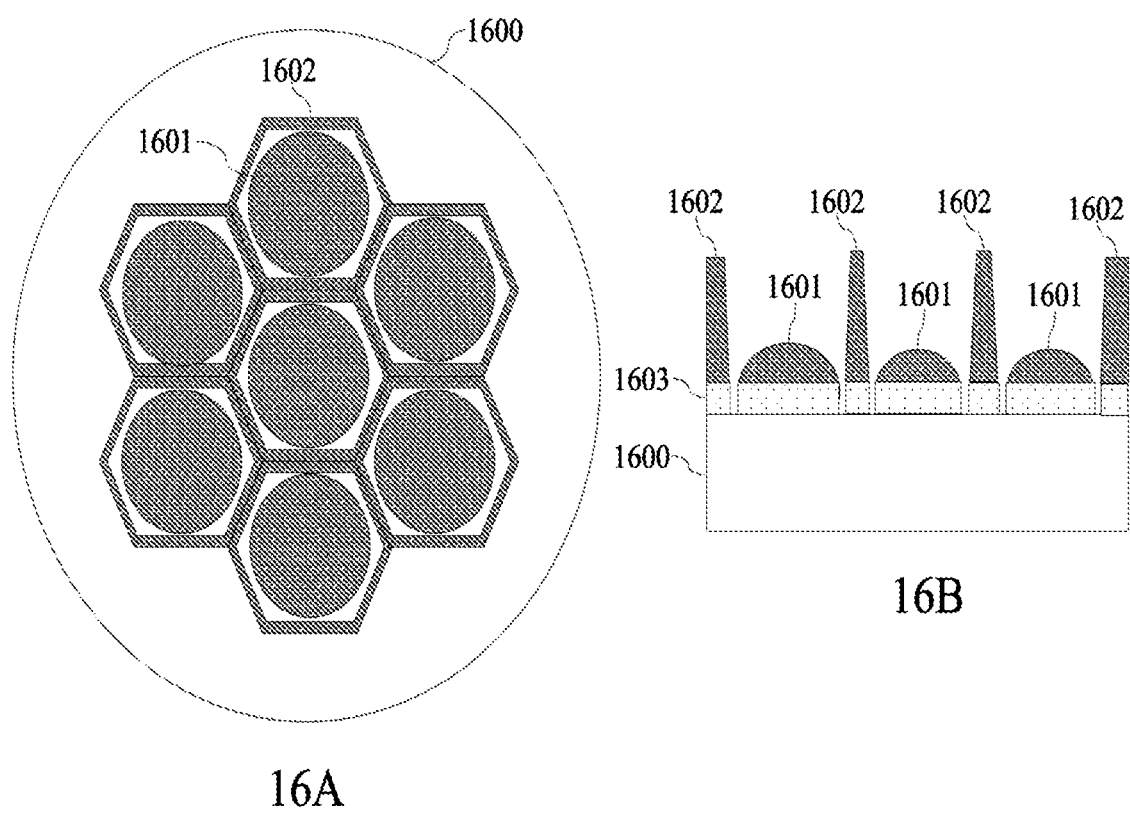
FIG. 16 is a diagram illustrating a third process of manufacturing a nanostructure including a disk and a mesh, according to an embodiment.

FIG. 16 is a diagram illustrating a third process of manufacturing a nanostructure including a disk and a mesh, according to an embodiment.

Referring to FIG. 16, illustrated are a plan view 16A and a cross-sectional view 16B that are related to the third process of manufacturing the nanostructure including the disk and the mesh. The third process may be a process of etching a metal material 1603 from a result of a second process.

Referring to the plan view 16A of FIG. 16, a circular bead 1601 may be inside a hexagonal bead 1602. In this case, in FIG. 16, the metal material 1603 deposited inside the hexagonal bead 1602 may be removed through etching, and a substrate 1600 may be exposed.

Referring to the cross-sectional view 16B of FIG. 16, the metal material 1603 corresponding to a gap between the circular bead 1601 and the hexagonal bead 1602 may be removed through the etching of the metal material 1603. In addition, the substrate 1600 may be exposed by the gap between the circular bead 1601 and the hexagonal bead 1602.

Figure 17:
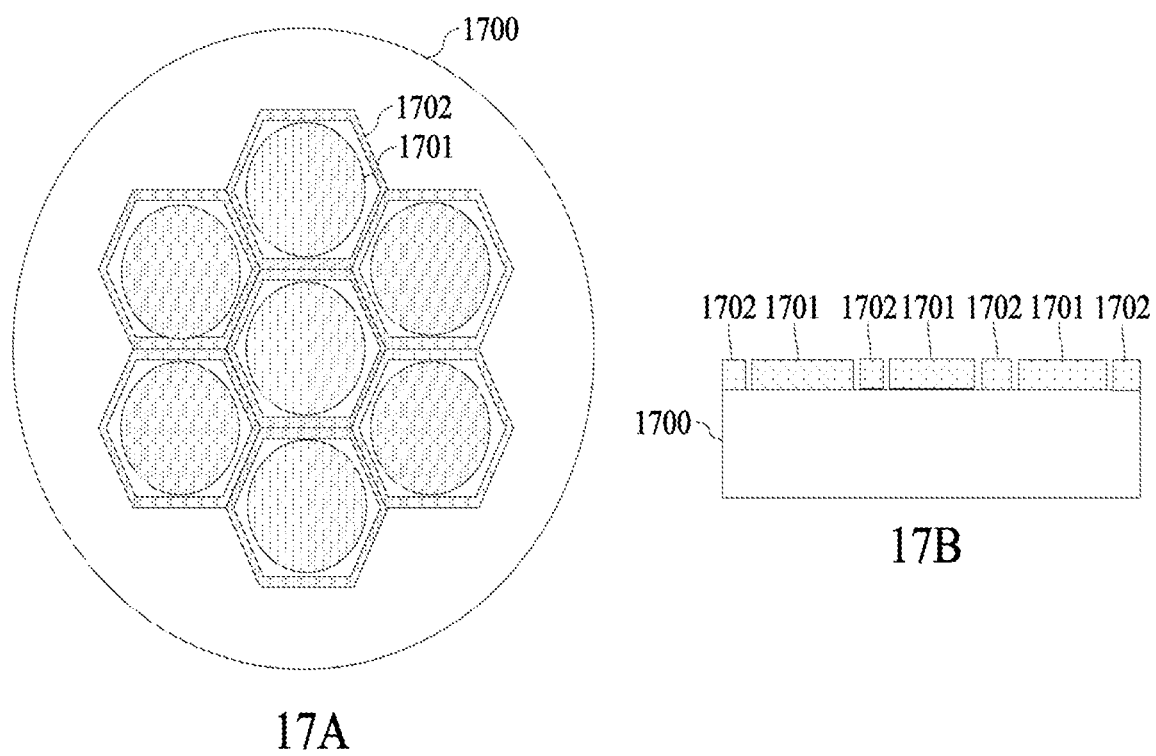
FIG. 17 is a diagram illustrating a fourth process of manufacturing a nanostructure including a disk and a mesh, according to an embodiment.

FIG. 17 is a diagram illustrating a fourth process of manufacturing a nanostructure including a disk and a mesh, according to an embodiment.

Referring to FIG. 17, illustrated are a plan view 17A and a cross-sectional view 17B that are related to the fourth process of manufacturing the nanostructure including the disk and the mesh. The fourth process may be a process of removing beads from a result of a third process.

Referring to the plan view 17A of FIG. 17, illustrated is a result of removing the beads illustrated in FIGS. 15 and 16. A circular disk 1701 at a lower end of a circular bead may be inside a hexagonal mesh 1702. In this case, the circular disk 1701 and the hexagonal mesh 1702 may be formed by removing the circular bead 1601 and the hexagonal bead 1602 illustrated in FIG. 16. Then, the circular disk 1701 and the hexagonal mesh 1702 may include a metal material exposed to the outside as the circular bead 1601 and the hexagonal bead 1602 illustrated in FIG. 16 are removed.

Referring to the cross-sectional view 17B of FIG. 17, illustrated is a result of removing the beads illustrated in the cross-sectional view 16B of FIG. 16. Then, a nanosized gap may be between the circular disk 1701 and the hexagonal mesh 1702 including a metal material. Accordingly, the nanostructure including the hexagonal mesh 1702 surrounding the circular disk 1701 and spaced apart by the nanosized gap from the circular disk 1701 on a substrate 1700 through the process described with reference to FIG. 17 may be provided.

The circular disk 1701 and the hexagonal mesh 1702 may be spaced apart by the nanosized gap from each other in the nanostructure proposed in the present disclosure. The nanosized gap may vary depending on a degree of etching of a bead. Specifically, the nanosized gap may increase as the time of etching of the bead increases.

Although the present specification includes details of a plurality of specific embodiments, the details should not be construed as limiting any invention or a scope that can be claimed, but rather should be construed as being descriptions of features that may be peculiar to specific embodiments of specific inventions. Specific features described in the present specification in the context of individual embodiments may be combined and implemented in a single embodiment. On the contrary, various features described in the context of a single embodiment may be implemented in a plurality of embodiments individually or in any appropriate sub-combination. Furthermore, although features may operate in a specific combination and may be initially depicted as being claimed, one or more features of a claimed combination may be excluded from the combination in some cases, and the claimed combination may be changed into a sub-combination or a modification of the sub-combination.

Likewise, although operations are depicted in a specific order in the drawings, it should not be understood that the operations must be performed in the depicted specific order or sequential order or all the shown operations must be performed in order to obtain a preferred result. In specific cases, multitasking and parallel processing may be advantageous. In addition, it should not be understood that the separation of various device components of the aforementioned embodiments is required for all the embodiments, and it should be understood that the aforementioned program components and apparatuses may be integrated into a single software product or packaged into multiple software products.

The embodiments disclosed in the present specification and the drawings are intended merely to present specific examples in order to aid in understanding of the present disclosure, but are not intended to limit the scope of the present disclosure. It will be apparent to one of ordinary skill in the art that various modifications based on the technical spirit of the present disclosure, as well as the disclosed embodiments, can be made.

What is claimed is:

1. A ring structure comprising:
primary metal in a disk form in a center of the ring structure;
secondary metal in a position spaced apart by a nanosized gap from the primary metal; and
a ring of which the width is as narrow as the nanosized gap, wherein
the nanosized gap varies depending on a degree of undercut applied to the primary metal.

2. The ring structure of claim 1, wherein
the nanosized gap varies depending on a degree of undercut etching the primary metal such that the width of the primary metal at a lower end of a bead used to manufacture the ring structure is less than the width of the bead.

3. The ring structure of claim 1, wherein
the nanosized gap increases as a degree of additional etching of the primary metal through undercut increases.

4. The ring structure of claim 1, wherein
the primary metal and the secondary metal are conductive and comprise the same material or different materials.

5. A ring disk structure comprising:
primary metal in a disk form in a center of the ring disk structure; and
secondary metal in a ring form surrounding the primary metal, wherein
the primary metal and the secondary metal are spaced apart from each other by a nanosized gap, and
the nanosized gap varies depending on a degree of undercut applied to the primary metal.

6. The ring disk structure of claim 5, wherein
the nanosized gap varies depending on a degree of undercut etching the primary metal such that the width of the primary metal at a lower end of a bead used to manufacture a ring structure is less than the width of the bead.

7. The ring disk structure of claim 5, wherein
a gap between rings that are formed of the secondary metal varies depending on a time of reflow of the bead at an upper end of the primary metal in a manufacturing process of the ring disk structure.

8. The ring disk structure of claim 5, wherein
the primary metal and the secondary metal are conductive and comprise the same material or different materials.

9. A method of manufacturing a ring structure, the method comprising:
depositing primary metal on a surface of a substrate or a cross-section of a core layer of an optical fiber;
close-packing beads on a surface of the deposited primary metal;
etching the close-packed beads;
etching the primary metal such that the width of the primary metal is as narrow as the width of the bead and performing undercut etching the primary metal such that the width of the primary metal is less than the width of the bead;
depositing secondary metal on the surface of the substrate exposed by a gap between the beads with the primary metal etched or on the cross-section of the core layer of the optical fiber; and
extracting the ring structure including a nanosized gap between the primary metal and the secondary metal by removing the beads, wherein
primary metal in a disk form is in a center of the ring structure and a ring as narrow as the nanosized gap is between the primary metal and the secondary metal.

10. The method of claim 9, wherein
the nanosized gap varies depending on a degree of undercut applied to the primary metal.

11. The method of claim 9, wherein
the nanosized gap varies depending on a degree of undercut etching the primary metal such that the width of the primary metal at a lower end of the bead is less than the width of the bead.

12. The method of claim 9, wherein
the nanosized gap increases as a degree of additional etching of the primary metal through undercut increases.

13. The method of claim 9, wherein
the primary metal and the secondary metal are conductive and comprise the same material or different materials.

* * * * *